US012651628B2

(12) United States Patent
Simsek-Ege et al.

(10) Patent No.: US 12,651,628 B2
(45) Date of Patent: Jun. 9, 2026

(54) MICROELECTRONIC DEVICES AND MEMORY DEVICES INCLUDING VERTICALLY SPACED TRANSISTORS AND STORAGE DEVICES, AND RELATED ELECTRONIC SYSTEMS

(71) Applicant: Micron Technology, Inc., Boise, ID (US)

(72) Inventors: Fatma Arzum Simsek-Ege, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 89 days.

(21) Appl. No.: 18/754,884

(22) Filed: Jun. 26, 2024

(65) Prior Publication Data

US 2025/0061936 A1 Feb. 20, 2025

Related U.S. Application Data

(60) Provisional application No. 63/520,060, filed on Aug. 16, 2023.

(51) Int. Cl.
*G11C 16/04* (2006.01)
*G11C 11/408* (2006.01)
(Continued)

(52) U.S. Cl.
CPC ...... *G11C 11/4085* (2013.01); *G11C 11/4091* (2013.01); *G11C 11/4097* (2013.01);
(Continued)

(58) Field of Classification Search
CPC ............ G11C 11/4085; G11C 11/4091; G11C 11/4097; H10B 12/482; H10B 12/485; H10B 12/50; H10B 12/315
See application file for complete search history.

(56) References Cited

U.S. PATENT DOCUMENTS 10,847,523 B1 * 11/2020 Yeh ........................ H10B 43/10
11,810,901 B2 11/2023 Simsek-Ege et al.
(Continued)

OTHER PUBLICATIONS

Sills et al., "Microelectronic Devices, and Related Memory Devices, and Electronic Systems", Filed Dec. 20, 2023, U.S. Appl. No. 18/391,522, 77 pages.
(Continued)

*Primary Examiner* — Pho M Luu
(74) *Attorney, Agent, or Firm* — TraskBritt

(57) ABSTRACT
A microelectronic device includes a first die and a second die vertically overlying and attached to the first die. The first die includes an array region and a peripheral region horizontally neighboring the array region. The array region includes memory cells respectively including a first transistor structure, a second transistor structure horizontally neighboring the first transistor structure, and a storage device vertically underlying and coupled to the first transistor structure and the second transistor structure. The peripheral region includes sub word line driver circuitry. The second die includes sense amplifier regions and a CMOS region horizontally neighboring some of the sense amplifier regions. The sense amplifier regions are within a horizontal area of the array region of the first die and include sense amplifier circuitry. Related memory devices and electronic systems are provided.

20 Claims, 27 Drawing Sheets

(51) Int. Cl.
    *G11C 11/4091*        (2006.01)
    *G11C 11/4097*        (2006.01)
    *H10B 12/00*          (2023.01)

(52) U.S. Cl.
    CPC ......... *H10B 12/315* (2023.02); *H10B 12/482*
    (2023.02); *H10B 12/485* (2023.02); *H10B*
              *12/50* (2023.02)

(56) References Cited

U.S. PATENT DOCUMENTS

| | | | |
|---|---|---|---|
| 11,848,309 B2 | 12/2023 | Simsek-Ege | |
| 11,916,032 B2 | 2/2024 | Simsek-Ege et al. | |
| 12,283,324 B2 * | 4/2025 | Zhang | ................. G11C 11/5628 |
| 2021/0111166 A1 * | 4/2021 | Zhang | ...................... H10D 1/68 |
| 2023/0387055 A1 | 11/2023 | Simsek-Ege | |
| 2023/0389275 A1 | 11/2023 | Simsek-Ege et al. | |
| 2023/0389284 A1 | 11/2023 | Simsek-Ege | |
| 2023/0397398 A1 | 12/2023 | Simsek-Ege et al. | |
| 2023/0397402 A1 | 12/2023 | Lee | |
| 2023/0411352 A1 | 12/2023 | Simsek-Ege | |

OTHER PUBLICATIONS

Simsek-Ege et al., "Microelectronic Devices and Memory Devices Including Vertically Spaced Transistors and Storage Devices, and Related Electronic Systems", Filed Jun. 17, 2024, U.S. Appl. No. 18/745,962, 67 pages.
Simsek-Ege et al., "Microelectronic Devices, and Related Memory Devices, and Electronic Systems", Filed Jul. 27, 2023, U.S. Appl. No. 63/516,076, 74 pages.
Simsek-Ege, "Microelectronic Devices and Memory Devices Including Vertically Spaced Transistors and Storage Devices, and Related Electronic Systems", Filed Nov. 28, 2023, U.S. Appl. No. 18/619,425, 71 pages.
Simsek-Ege, "Microelectronic Devices, and Related Memory Devices, and Electronic Systems", Filed Nov. 28, 2023, U.S. Appl. No. 18/522,120, 85 pages.

* cited by examiner

100

136
107
135
105
105
107
110
126

103

E E

144

109

105

103

101

105
110
105
144
146
144
126
135

F F 110
109
146
144
110
105

103

X
Y Z

MICROELECTRONIC DEVICES AND MEMORY DEVICES INCLUDING VERTICALLY SPACED TRANSISTORS AND STORAGE DEVICES, AND RELATED ELECTRONIC SYSTEMS

CROSS-REFERENCE TO RELATED APPLICATION

This application claims the benefit under 35 U.S.C. § 119 (e) of U.S. Provisional Patent Application Ser. No. 63/520, 060, filed Aug. 16, 2023, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices including memory cells individually comprising vertically spaced transistors and storage devices, and to related memory devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often seek to design architectures that are not only compact, but offer performance advantages, as well as simplified designs.

One example of a semiconductor device is a memory device. Memory devices are generally provided as internal integrated circuits in computers or other electronic devices. There are many types of memory including, but not limited to, random-access memory (RAM), read only memory (ROM), dynamic random access memory (DRAM), synchronous dynamic random access memory (SDRAM), flash memory, and resistance variable memory. Non-limiting examples of resistance variable memory include resistive random access memory (RRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines, data lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

To improve the operating parameters of the memory cell, some have formed so-called two transistor-one capacitor memory cells wherein the storage device is in communication with two transistors and some have desired to increase the capacitance of the storage device. However, increasing the number of transistors for each memory cell undesirably increases the area occupied by the memory cells and decreases the packing density of the memory cells of the array. In addition, increasing the capacitance of the storage device increases the area occupied by the memory cell.

DETAILED DESCRIPTION

Figure 1A:
FIG. 1A through FIG. 1M are simplified, partial top-down views (FIG. 1A and FIG. 1D), simplified, partial vertical cross-sectional views (FIG. 1B, FIG. 1C, FIG. 1E through FIG. 1I, FIG. 1L, and FIG. 1M), a simplified, partial electrical schematic view (FIG. 1J), and a simplified, partial horizontal cross-sectional view (FIG. 1K) illustrating a method of forming a first microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as DRAM memory device), apparatus, memory device, or electronic system, or a complete microelectronic device, apparatus, memory device, or electronic system including conductive contact structures. The structures described below do not form a complete microelectronic device, apparatus, memory device, or electronic system. Only those process acts and structures necessary to understand the embodiments described herein are described in detail below. Additional acts to form a complete microelectronic device, apparatus, memory device, or electronic system from the structures may be performed by conventional techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth.

According to embodiments described herein, a microelectronic device including a first microelectronic device structure (e.g., a first die) attached to a second microelectronic device structure. The first microelectronic device structure includes an array region including memory cells, each memory cell including a pair of transistor structures in operable communication with a storage device (e.g., a capacitor) vertically overlying the pair of transistor structures. Since the memory cells include two transistor structures and a storage device, they may comprise and be referred to herein as two transistor-one capacitor (2T-1C) memory cells. The first microelectronic device structure further includes peripheral regions horizontally neighboring the array region. The peripheral regions include sub word line driver (SWD) circuitry configured to effectuate control operations of the memory cells of the array or memory cells. The second microelectronic device structure may vertically overlie the first microelectronic device structure and includes sense amplifier (SA) regions comprising sense amplifier circuits configured for effectuating control operations of the memory cells of the memory array. The sense amplifier regions may vertically overlie and be located within horizontal boundaries of the array region. The second microelectronic device structure may further include additional complementary metal oxide semiconductor (CMOS) regions including CMOS circuitry configured for effectuating control operations of the memory cells of the memory array, the additional CMOS regions horizontally offset from the memory array region and located within horizontal boundaries of the peripheral regions.

Forming the microelectronic device to include the first microelectronic device structure including the memory cells and the sub word line driver circuits, and the second microelectronic device structure vertically overlying the first microelectronic device structure and comprising sense amplifier regions and additional CMOS circuits facilitates forming the microelectronic device to include a greater density of memory cells in a relatively smaller horizontal area (e.g., horizontal footprint) compared to conventional microelectronic devices.

FIG. 1A through FIG. 1L are various views (described in further detail below) illustrating a microelectronic device structure at different processing stages of a method of forming a microelectronic device (e.g., a memory device, such as a DRAM memory device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device.

Figure 1B:
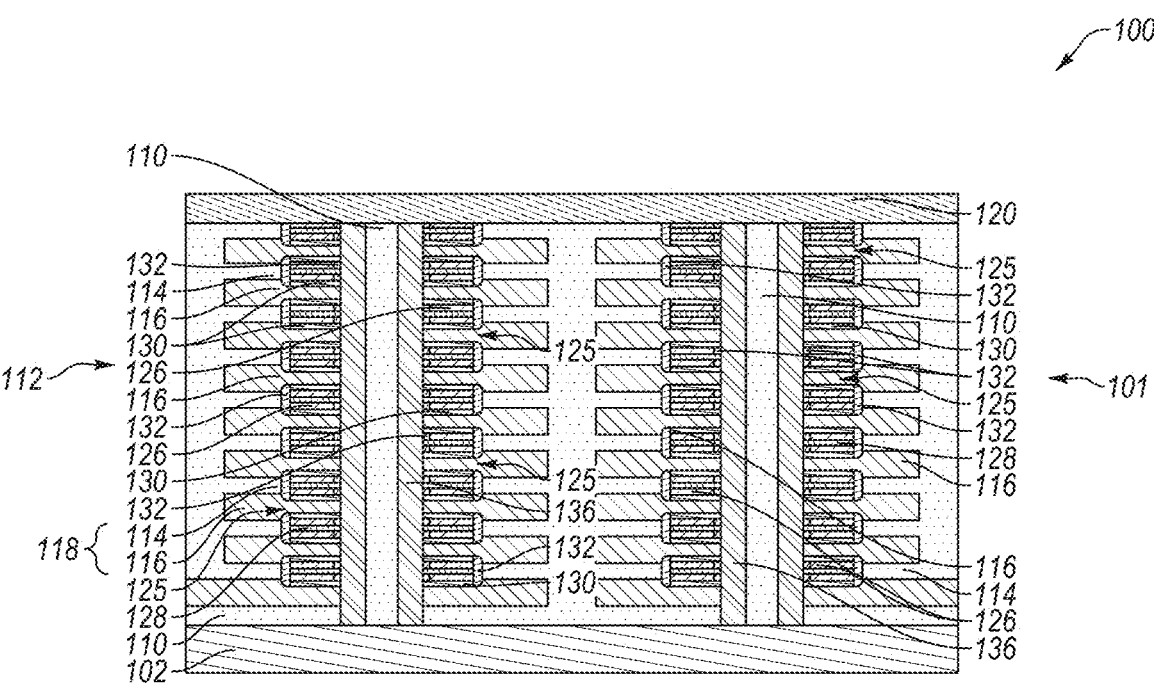

FIG. 1A is a simplified, partial top-down view of a first microelectronic device structure 100 (also referred to herein as a "first die"), in accordance with embodiments of the disclosure. FIG. 1B is a simplified, partial vertical cross-sectional view of the first microelectronic device structure 100 taken through section line B-B of FIG. 1A. With reference to FIG. 1A and FIG. 1B, the first microelectronic device structure 100 includes an array region 101 and peripheral regions 103 horizontally neighboring (e.g., in the X-direction) the array region 101. In some embodiments, the array region 101 is located horizontally between (e.g., in the X-direction) two (2) neighboring peripheral regions 103.

Within the array region 101, the first microelectronic device structure 100 includes active regions 105 (FIG. 1A) separated from one another by first trenches 107 extending in a first horizontal direction (e.g., in the X-direction) and comprising a first insulative material 110 and second trenches 109 extending in a second horizontal direction (e.g., in the Y-direction) and comprising the first insulative material 110. The active regions 105 may be separated from one another by the first trenches 107 and the second trenches 109. In the view of FIG. 1A, it will be understood that the Z-axis is in and out of the view of the page.

Although FIG. 1A illustrates only twenty-four (24) active regions 105, the disclosure is not so limited. It will be understood that the array region 101 includes a greater quantity of active regions 105, such as greater than one million active regions 105, greater than ten million active regions 105, or greater than one billion active regions 105.

The first insulative material 110 may be formed of and include one or more of at least one insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). In some embodiments, the first insulative material 110 is formed of and includes a dielectric oxide material, such as $SiO_x$ (e.g., $SiO_2$).

Referring to FIG. 1B, the first microelectronic device structure 100 includes a stack structure 112 comprising a vertically alternating (e.g., in the Z-direction) sequence of a second insulative material 114 and a semiconductive material 116 arranged in tiers 118 and vertically overlying (e.g., in the Z-direction) a first base structure 102.

The stack structure 112 may be formed to include any desired number of the tiers 118. By way of non-limiting example, the stack structure 112 may be formed to include eight (8) of the tiers 118. In other embodiments, the stack structure 112 may be formed to include less than eight (8) of the tiers 118, such as less than or equal to four (4) of the tiers 118. In some embodiments, the stack structure 112 is formed to include two (2) of the tiers 118. As described in further detail herein, a quantity of the tiers 118 may correspond to an equivalent channel length of transistors structures (e.g., transistor structures 142 (FIG. 1I)) of memory cells (e.g., memory cells 160 (FIG. 1I)).

The first base structure 102 may include a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials (e.g., one or more of a silicon material, such as monocrystalline silicon or polycrystalline silicon; silicon-germanium; germanium; gallium arsenide; a gallium nitride; and indium phosphide). In some embodiments, the first base structure 102 comprises a silicon wafer.

The second insulative material 114 may be formed of and include insulative material, such as one or more of the materials described above with reference to the first insulative material 110. In some embodiments, the second insulative material 114 is formed of and includes dielectric oxide material, such as $SiO_x$ (e.g., $SiO_2$).

The semiconductive material 116 may be formed of and include at least one semiconductive material, such as silicon (e.g., monocrystalline silicon, polysilicon). In some embodiments, the semiconductive material 116 is formed of and includes epitaxially grown silicon. In additional embodiments, the semiconductive material 116 is formed of and includes monocrystalline silicon.

A third insulative material 120 may vertically overlie (e.g., in the Z-direction) the stack structure 112. The third insulative material 120 may be formed of and include insulative material, such as one or more of the materials described above with reference to the first insulative material 110. In some embodiments, the third insulative material 120 is formed of and includes dielectric oxide material (e.g., $SiO_x$, such as $SiO_2$).

With collective reference to FIG. 1A and FIG. 1B, a vertical stack of channel regions 125 may be formed to vertically extend (e.g., in the Z-direction) through the stack structure 112. The vertical stack of channel regions 125 may include vertically spaced (e.g., in the Z-direction) channel regions 125, each formed from and including the semiconductive material 116.

Within horizontal areas of the array regions 101, the semiconductive material 116 may be doped with one or more conductivity enhancing species (e.g., dopants) to form the channel regions 125 (FIG. 1B). In some embodiments, within the channel regions 125 the semiconductive material 116 is doped with one or more N-type dopants, such as one or more of arsenic ions, phosphorous ions, and antimony ions. In other embodiments, within the channel region 125 are doped with one or more P-type dopants, such as one or more of boron ions, aluminum ions, and gallium ions. In some embodiments, each channel region 125 is positioned horizontally between (e.g., in the X-direction, in the Y-direction) a source region and a drain region of the semiconductive material 116.

First conductive structures 126 (e.g., first conductive line structures, word lines, access lines) may vertically overlie (e.g., in the Z-direction) and vertically underlie (e.g., in the Z-direction) each of the channel regions 125 within the array regions 101. In some embodiments, the channel regions 125 are vertically surrounded by the first conductive structures 126. Vertically neighboring (e.g., in the Z-direction) first conductive structures 126 between vertically neighboring (e.g., in the Z-direction) channel regions 125 may be spaced from each other by a fourth insulative material 128. While the first conductive structures 126 vertically underlie (e.g., in the Z-direction) a vertically uppermost (e.g., in the Z-direction) surface of the first microelectronic device structure 100, the first conductive structures 126 are illustrated in FIG. 1A to illustrate the relative horizontal positions of the first conductive structures 126 relative to other features of the first microelectronic device structure 100. The first conductive structures 126 are illustrated in dashed lines in FIG. 1A.

The first conductive structures 126 may individually be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride ($TiN_y$), tantalum nitride ($TaN_y$), tungsten nitride ($WN_y$), titanium aluminum nitride ($TiAl_xN_y$), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity.

The first conductive structures 126 may horizontally extend (e.g., substantially linearly horizontally extend) in a first horizontal direction (e.g., in the X-direction) through the array region 101 and into the peripheral regions 103 horizontally adjacent thereto. The first conductive structures 126 may horizontally extend in parallel in the first horizontal direction. In some embodiments, the first conductive structures 126 are employed as word lines.

The first conductive structures 126 may collectively form a vertical stack structure 135 (FIG. 1A). The vertical stack structure 135 horizontally extends (e.g., in the X-direction) from the peripheral regions 103 and through the array region 101. The vertical stack structure 135 comprises levels of the first conductive structures 126 vertically (e.g., in the Z-direction) spaced from one another. In some embodiments, the vertical stack structure 135 horizontally terminates (e.g., in the X-direction) within the horizontal areas of the peripheral regions 103.

The fourth insulative material 128 may be formed of and include an insulative material, such as one or more of the materials described above with reference to the first insulative material 110. In some embodiments, the fourth insulative material 128 is formed of and include an oxide material (e.g., silicon dioxide).

Referring to FIG. 1B, each of the channel regions 125 is at least partially surrounded by a dielectric material 130, which may also be referred to herein as a "gate dielectric material." A portion of an individual first conductive structure 126 (e.g., word line) directly vertically neighboring (e.g., in the Z-direction) and located within a horizontal area of the dielectric material 130 may be referred to as a "gate electrode." In some embodiments, the first conductive structures 126 are separated from the channel regions 125 by the dielectric material 130.

The dielectric material 130 may be formed of and include insulative material. By way of non-limiting example, the dielectric material 130 may be formed of and include one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), or a dielectric carboxynitride material (e.g., silicon carboxynitride (SiOCN)).

Vertically neighboring (e.g., in the Z-direction) channel regions 125 are spaced from one another by a fifth insulative material 132. In some embodiments, the fifth insulative material 132 surrounds at least a portion of the dielectric material 130 and horizontally intervenes (e.g., in the Y-direction) between the dielectric material 130 and the second insulative material 114.

The fifth insulative material 132 may be formed of and include insulative material having etch selectivity with respect to the second insulative material 114. In some embodiments, the fifth insulative material 132 comprises a dielectric nitride material (e.g., silicon nitride ($Si_3N_4$)) or a dielectric oxynitride material (e.g., silicon oxynitride). In some embodiments, the fifth insulative material 132 comprises silicon nitride.

With reference to FIG. 1A and FIG. 1B, conductive pillar structures 136 (e.g., digit line contact structures, bit line contact structures) may vertically extend (e.g., in the Z-direction) through the first microelectronic device structure 100, and horizontally neighbor (e.g., in the Y-direction) the levels of the semiconductive material 116 and each of the dielectric material 130, the fourth insulative material 128, and the fifth insulative material 132. Conductive pillar structures 136 may be in electrical communication with the channel regions 125. The conductive pillar structures 136 may horizontally neighbor (e.g., in the Y-direction) a source region or a drain region of the semiconductive material 116. In some embodiments, the conductive pillar structures 136 are employed as digit line contact structures (e.g., bit line contact structures, also referred to as "BITCON" structures), as described in further detail below.

With reference to FIG. 1A and FIG. 1B, the conductive pillar structures 136 may contact sidewalls of the levels of the semiconductive material 116 and sides of the each of the dielectric material 130, the fourth insulative material 128, and the fifth insulative material 132. The conductive pillar structures 136 may individually contact the channel regions 125 of the vertical stack of channel regions 125. In use and operation, the conductive pillar structures 136 may be in electrical communication with the semiconductive material 116 to provide a voltage to the semiconductive material 116. The voltage may be applied from a conductive line structure (e.g., a digit line structure, a bit line structure) subsequently formed to be in operable communication with a respective conductive pillar structure 136, as described in further detail below with reference to FIGS. 1I and 1J.

The conductive pillar structures 136 may be formed of and include one or more conductive materials, such as one or more of the conductive material previously described with reference to the first conductive structures 126. In some embodiments, portions of an individual conductive pillar structures 136 horizontally adjacent to the sidewalls of the levels of the semiconductive material 116 and sides of the each of the dielectric material 130, the fourth insulative material 128, and the fifth insulative material 132 are formed of and include conductively doped polysilicon, such as N+ doped polysilicon. In additional embodiments, the conductive pillar structures 136 does not include the conductively doped polysilicon horizontally adjacent to the sidewalls of the levels of the semiconductive material 116 and sides of the each of the dielectric material 130, the fourth insulative material 128, and the fifth insulative material 132.

Figure 1C:
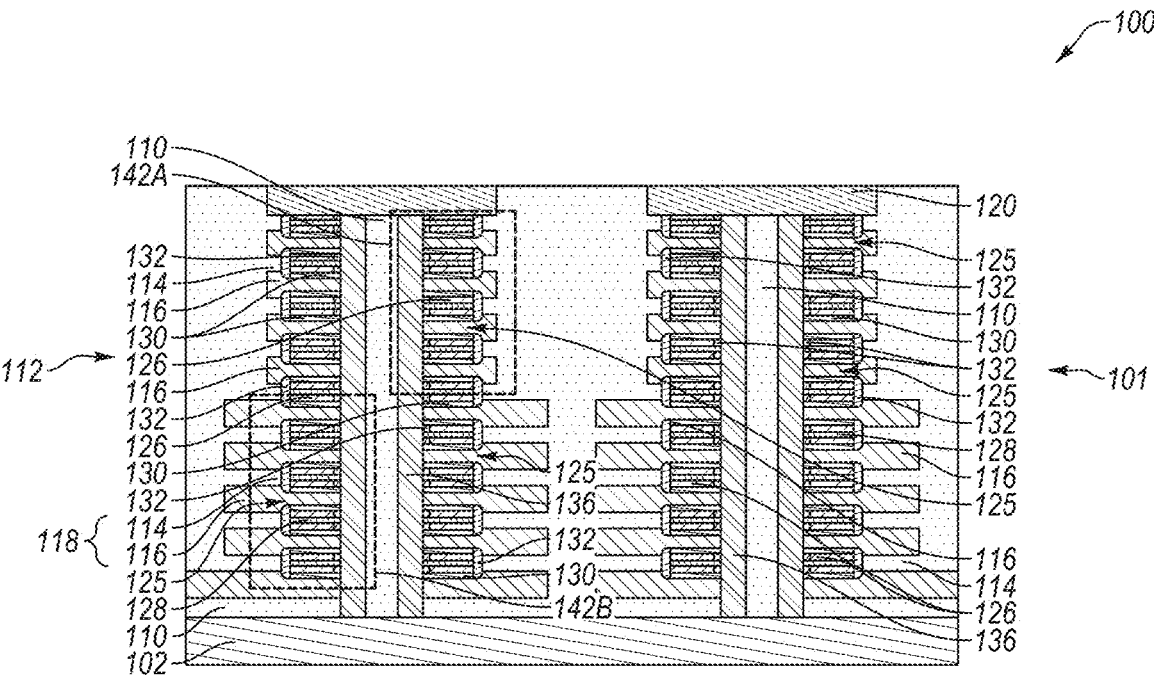

FIG. 1C is a simplified, partial vertical cross-sectional view of the first microelectronic device structure 100 at a processing stage subsequent to that illustrated in FIG. 1A and FIG. 1B. The simplified, partial vertical cross-sectional view of FIG. 1C is taken through the same plane as that illustrated in FIG. 1B, but at a subsequent processing stage than that illustrated and described with reference to FIG. 1A and FIG. 1B.

With reference to FIG. 1C, a mask material may be formed over the first microelectronic device structure 100, and portions of the vertically upper (e.g., in the Z-direction) levels of the tiers 118 of the second insulative material 114 and the semiconductive material 116 of the channel regions 125 may be removed. Removal of the portions of the tiers

118 of the second insulative material 114 and the semiconductive material 116 of the channel regions 125 of the vertically upper (e.g., in the Z-direction) tiers 118 may form upper channel regions 125 having a relatively smaller horizontal dimension (e.g., in the Y-direction) than the channel regions 125 of relatively vertically lower (e.g., in the Z-direction) tiers 118.

A respective group of vertically upper (e.g., in the Z-direction) channel regions 125 (e.g., the vertically upper one half of the channel regions 125 of the vertical stack of channel regions 125) may form a first transistor structure 142A (also referred to herein as "an upper transistor structure 142A"); and a respective group of the vertically lower (e.g., in the Z-direction) channel regions 125 (e.g., the vertically lower one half of the channel regions 125 of the vertical stack of channel regions 125) may form a second transistor structure 142B (also referred to herein as "a second transistor structure 142B") vertically underlying (e.g., in the Z-direction) the first transistor structure 142A. The first transistor structures 142A may be vertically above (e.g., in the Z-direction) the second transistor structures 142B. One of the first transistor structures 142A is illustrated in dashed box 142A in FIG. 1C; and one of the second transistor structures 142B is illustrated in dashed box 142B in FIG. 1C. The first transistor structures 142A and the second transistor structures 142B are collectively referred to herein as "transistor structures 142." In some embodiments, the transistor structures 142 individually have one of a double gate (G2S) configuration, a tri-gate (G3S) configuration, and a gate-all-around (GAA) configuration, such that multiple boundaries of individual channel regions 125 thereof are at least partially covered (e.g., surrounded) by the first conductive structures 126.

Each of the first transistor structures 142A may include substantially the same quantity of channel regions 125 as each other of the first transistor structures 142A. In addition, each of the second transistor structures 142B may include substantially the same quantity of channel regions 125 as each other of the second transistor structures 142B. Each first transistor structure 142A may include a same quantity of channel regions 125 as each second transistor structure 142B. In some embodiments, each of the first transistor structures 142A individually includes four (4) levels of the channel regions 125; and each of the second transistor structures 142B individually includes four (4) levels of the channel regions 125.

After removing the portions of the vertically upper (e.g., in the Z-direction) tiers 118 of the second insulative material 114 and the semiconductive material 116 to form the first transistor structures 142A having a relatively smaller horizontal dimension (e.g., in the Y-direction) than the second transistor structures 142B, the openings may be filled with insulative material, such as one or more of the materials described above with reference to the first insulative material 110. Since the openings are filled with insulative material that may be the same as the first insulative material 110, the insulative material filling the openings is illustrated in FIG. 1C as the same as the first insulative material 110.

Figure 1D:
Figure 1E:
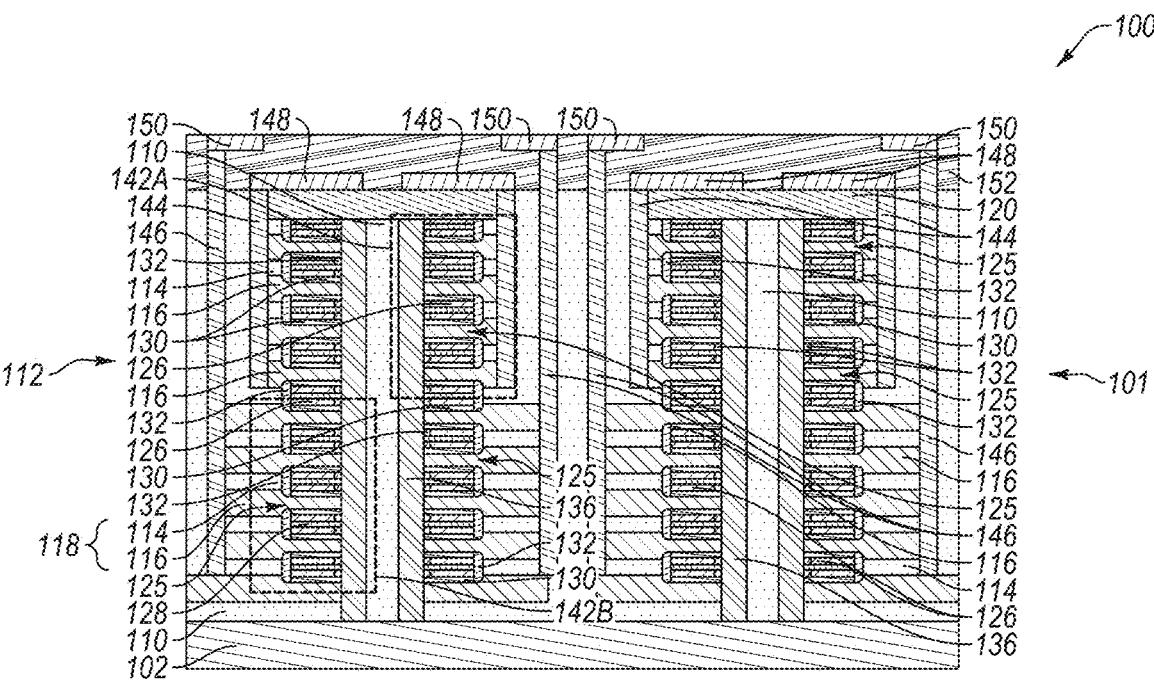
Figure 1E:
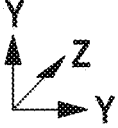
Figure 1F:
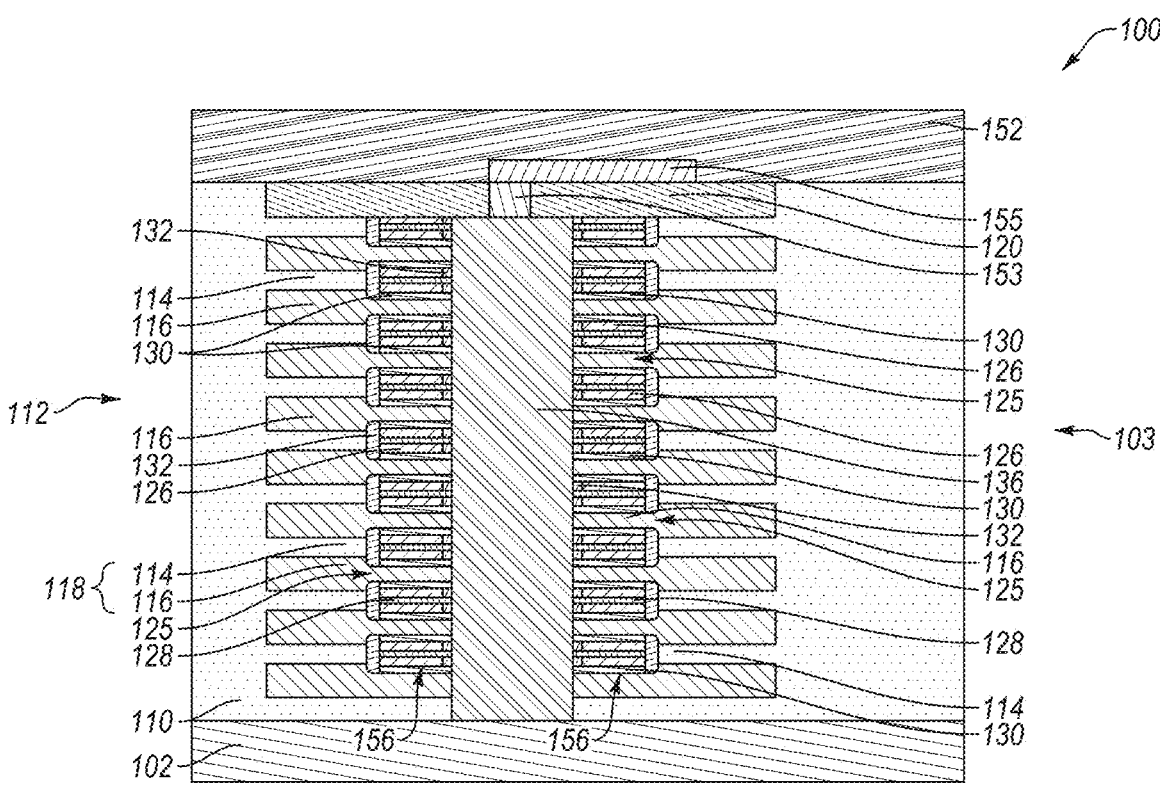

FIG. 1D through FIG. 1F illustrate the first microelectronic device structure 100 at a processing stage subsequent to that described with reference to FIG. 1C. FIG. 1D is a simplified, partial top-down view of the first microelectronic device structure 100; FIG. 1E is a simplified, partial vertical cross-sectional view of the first microelectronic device structure 100 through section line E-E of FIG. 1D; and FIG.

1F is a simplified, partial vertical cross-sectional view of the first microelectronic device structure 100 taken through section line F-F of FIG. 1D.

Referring collectively to FIGS. 1D and 1E, after forming the first transistor structures 142A and the second transistor structures 142B, first conductive contact structures 144 may individually be formed to vertically (e.g., in the Z-direction) extend through at least a portion of the first microelectronic device structure 100, and second conductive contact structures 146 may individually be formed to vertically extend (e.g., in the Z-direction) through another portion of the first microelectronic device structure 100. Each first conductive contact structure 144 may respectively contact (e.g., electrically contact) one of the transistor structures 142, such as one of the first transistor structures 142A. Each second conductive contact structure 146 may respectively contact (e.g., electrically contact) an additional one of the transistor structures 142, such as one of the second transistor structures 142B. In some embodiments, the first conductive contact structures 144 are in contact with the first transistor structures 142A, and the second conductive contact structures 146 are in contact with the second transistor structures 142B. The first microelectronic device structure 100 may include an equal quantity of the first conductive contact structures 144 and the second conductive contact structures 146.

As shown in FIG. 1E, in some embodiments, vertically upper (e.g., in the Z-direction) surfaces of the first conductive contact structures 144 are vertically offset (e.g., in the Z-direction) from vertically upper (e.g., in the Z-direction) surfaces of the second conductive contact structures 146. For example, the vertically upper surfaces of the second conductive contact structures 146 may vertically overlie (e.g., in the Z-direction) the vertically upper surfaces of the first conductive contact structures 144.

Referring to FIG. 1E, first routing structures 148 may be formed in contact (e.g., electrical contact) with the first conductive contact structures 144 in contact (e.g., in electrical contact) with the first transistor structures 142A. In addition, second routing structures 150 may be formed in contact (e.g., in electrical contact) with the second conductive contact structures 146 in contact (e.g., in electrical contact) with the second transistor structures 142B.

The first routing structures 148 and the second routing structures 150 may be electrically insulated from one another by way of a seventh insulative material 152. The first routing structures 148 and the second routing structures 150 may arranged within and covered by the seventh insulative material 152. The first routing structures 148 and the second routing structures 150 may individually be configured to reroute conductive connections between respective ones of the first conductive contact structures 144 and the second conductive contact structures 146 and subsequently formed storage devices (e.g., storage devices 158 (FIG. 1G)). The first routing structures 148 and the second routing structures 150 may also be referred to herein as "redistribution line" (RDL) structures or "redistribution material" (RDM) structures.

As shown in FIG. 1D, first groups (e.g., columns) of the first conductive contact structures 144 may be formed to extend parallel in the X-direction, and second groups (e.g., rows) of the first conductive contact structures 144 may be formed to extend parallel in the Y-direction. In addition, first groups (e.g., columns) of the second conductive contact structures 146 may be formed to extend parallel in the X-direction, and second groups (e.g., rows) of the second conductive contact structures 146 may be formed to extend parallel in the Y-direction. A respective first group (e.g., column) of the first conductive contact structures 144 may horizontal overlap (e.g., be substantially horizontally aligned with) a respective first group (e.g., column) of the second conductive contact structures 146 in the X-direction. In addition, each second group (e.g., row) of the first conductive contact structures 144 may be horizontally offset from second group (e.g., row) of the second conductive contact structures 146 in the Y-direction. A respective first group of the first conductive contact structures 144 and a respective first group of the second conductive contact structures 146 may horizontally overlap (e.g., be substantially horizontally aligned with) a respective first group (e.g., column) of the conductive pillar structures 136.

In some embodiments, the first conductive contact structures 144 and the second conductive contact structures 146 are formed consecutively relative to one another. For example, referring to FIG. 1E, the first conductive contact structures 144 may be formed through the portions of the first microelectronic device structure 100, and then the first routing structures 148 may be formed in contact with the first conductive contact structures 144.

Thereafter, the second conductive contact structures 146 may be formed, and then the second routing structures 150 may be formed in contact with the second conductive contact structures 146. After forming the first conductive contact structures 144 and the first routing structures 148, the seventh insulative material 152 may be formed vertically over (e.g., in the Z-direction) the first conductive contact structures 144 and the first routing structures 148. After forming the seventh insulative material 152, the second conductive contact structures 146 may be formed through the seventh insulative material 152 and in contact with the channel regions 125 of the second transistor structures 142B, and then the second routing structures 150 may be formed vertically over and in contact with the second conductive contact structures 146.

Each of the first conductive contact structures 144, the second conductive contact structures 146, the first routing structures 148, and the second routing structures 150 may individually be formed of and include conductive material, such as one or more of the materials described above with reference to the conductive structures 126. In some embodiments, each of the first conductive contact structures 144, the second conductive contact structures 146, the first routing structures 148, and the second routing structures 150 individually comprise a metallic material, such as tungsten.

The seventh insulative material 152 may be formed of and include insulative material, such as one or more of the materials described above with reference to the first insulative material 110. In some embodiments, the seventh insulative material 152 is formed of and includes dielectric oxide material, such as $SiO_x$ (e.g., $SiO_2$).

With reference to FIG. 1F, the peripheral region 103 includes the stack structure 112 of the tiers 118 of the second insulative material 114 and the semiconductive material 116. The peripheral region 103 may include additional vertical stack structures 156 of the conductive structures 126. The additional vertical stack structure 156 may include substantially a same quantity of levels of the conductive structures 126 as the vertical stack structures 135 (FIG. 1D).

In some embodiments, within the peripheral regions 103, third conductive contact structures 153 may be formed in contact with (e.g., in electrical communication with) the conductive pillar structures 136; and third routing structures 155 may be formed in contact with (e.g., in electrical communication with) the third conductive contact structures 153. In use and operation, application of a voltage to the conductive pillar structure 136 in contact with (e.g., in electrical communication with) channel regions 125 of the additional vertical stack structures 156 may facilitate control operations of transistor structures of the additional vertical stack structures 156.

Each of the third conductive contact structures 153 and the third routing structures 155 may individually be formed of and include conductive material, such as one or more of the materials described above with reference to the conductive structures 126. In some embodiments, each of the third conductive contact structures 153 and the third routing structures 155 individually comprise metallic material, such as tungsten.

As described in additional detail herein, the additional vertical stack structure 156 of the conductive structures 126 of the peripheral region 103 may comprise gate structures of sub word line drivers (SWDs) for memory cells (e.g., memory cells 160 (FIG. 1I)) subsequently formed within the array regions 101 (FIG. 1D). The conductive structures 126 of the additional vertical stack structure 156 may be in electrical communication with the memory cells within the array region 101. For example, the conductive structures 126 of the additional vertical stack structure 156 may comprise the same conductive structures 126 of the array region 101, such that application of a voltage to a conductive structure 126 may induce a current in a channel region 125 in the peripheral region 103 and another channel region 125 in the array region 101. In some embodiments, the peripheral regions 103 horizontally neighboring (e.g., in the X-direction) a respective array region 101 include SWD circuits configured to effectuate control operations of memory cells (e.g., memory cells 160 (FIG. 1I)) lateral formed within of the array region 101, wherein an individual memory cell includes two (2) of the transistor structures 142 and a later-formed storage node structure (e.g., capacitor). Since the peripheral regions 103 include SWD circuitry, the peripheral regions 103 may also be referred to herein as SWD regions.

Figure 1G:
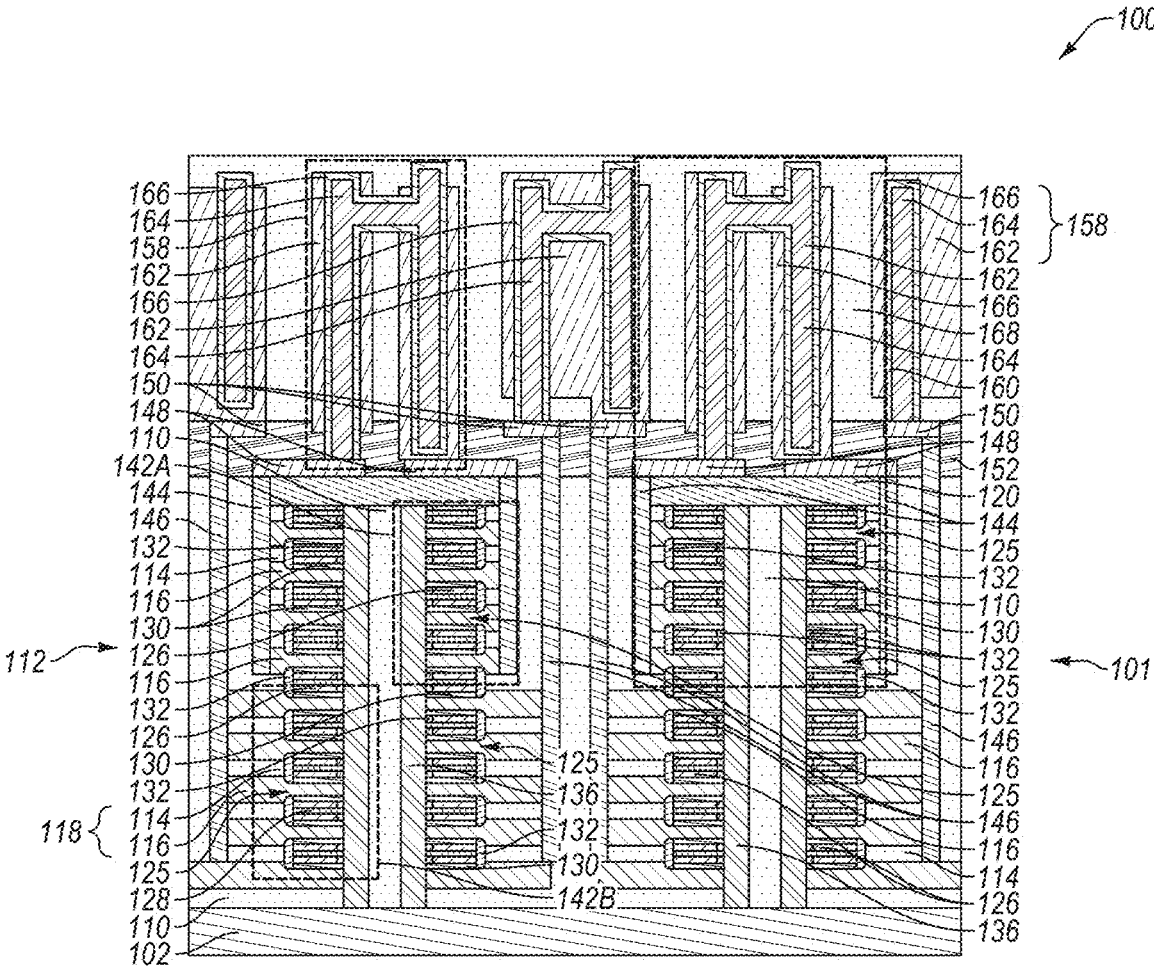
Figure 1H:
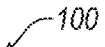
Figure 1H:
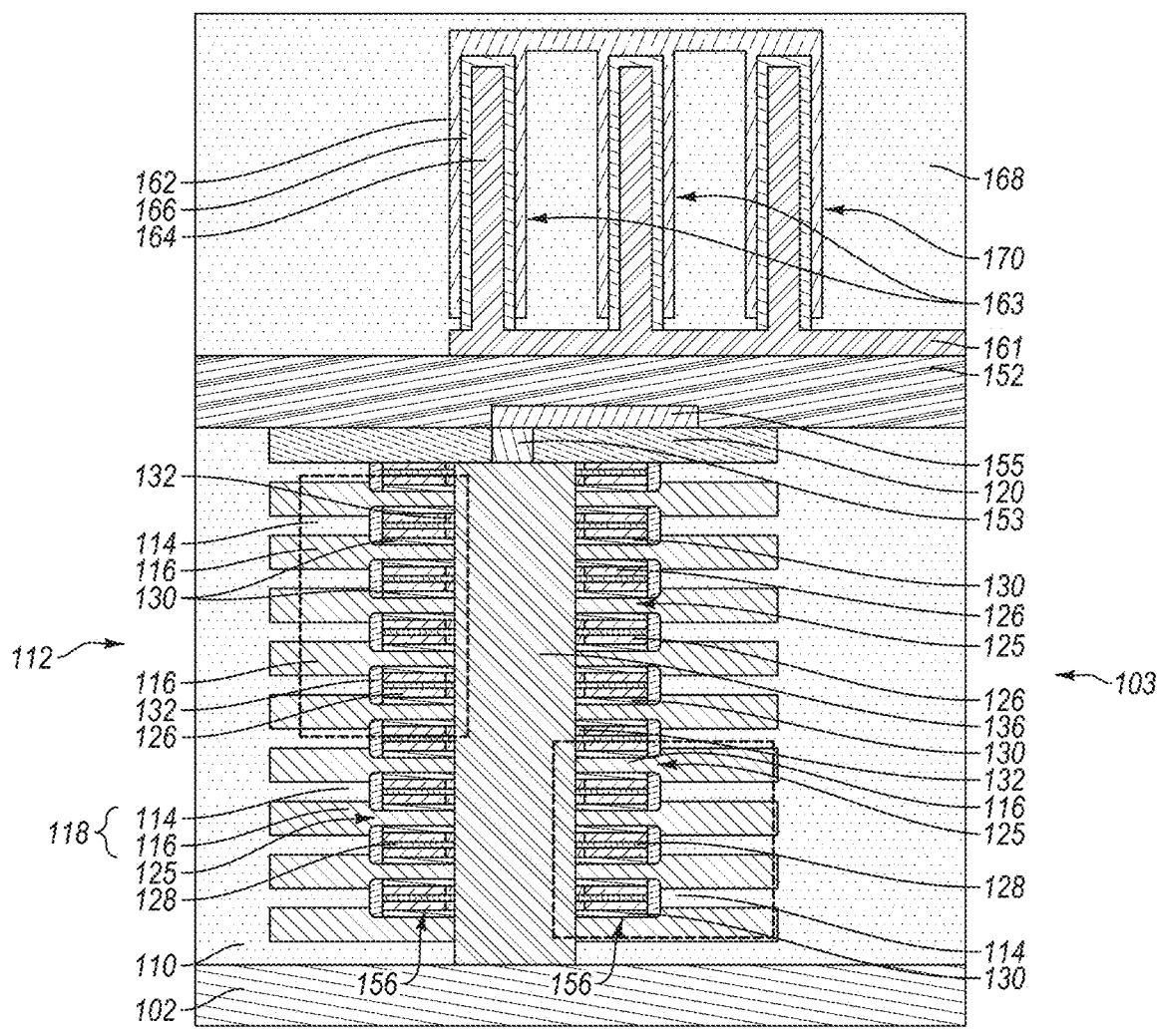
Figure 1H:
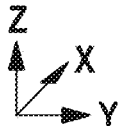

FIG. 1G is a simplified, partial vertical cross-sectional view of the first microelectronic device structure 100 at a processing stage subsequent to that illustrated in FIG. 1D through FIG. 1F. The simplified, partial vertical cross-sectional view of FIG. 1G is taken through the same plane as the cross-sectional view of FIG. 1E, but at a processing stage subsequent to that illustrated in FIG. 1E. FIG. 1H is a simplified, partial vertical cross-sectional view of the first microelectronic device structure 100 at a processing stage subsequent to that illustrated in FIG. 1D through FIG. 1F. The simplified, partial vertical cross-sectional view of FIG. 1H is taken through the same plane as the cross-sectional view of FIG. 1F, but at a processing stage subsequent to that illustrated in FIG. 1F.

With reference to FIG. 1G, after forming the first conductive contact structures 144, the second conductive contact structures 146, the first routing structures 148, and the second routing structures 150, storage devices 158 (e.g., capacitors) may be formed within the array region 101 (FIG. 1D). The storage devices 158 may be formed to vertically overlie (e.g., in the Z-direction) the transistor structures 142, and may be in electrical communication with the transistor structures 142 by way of the first routing structures 148 and the second routing structures 150. The storage devices 158 and the transistor structures 142 may together form memory cells 160. An individual memory cell 160 may include one (1) of the storage devices 158 and two (2) of the transistor structures 142. Since the memory cells 160 respectively include two (2) transistor structures 142 and one (1) storage device 158, the memory cells 160 may be referred to herein as two transistor, one capacitor (2T-1C) memory cells. One (1) of the memory cells 160 is illustrated by way of a dashed box 160 in FIG. 1G.

The storage devices 158 may individually include a first electrode 162 (also referred to herein as an "outer electrode," "a first electrode plate," or a "first node structure"), a second electrode 164 (also referred to herein as an "inner electrode," "a second electrode plate," or a "second node structure"), and a dielectric material 166 between the first electrode 162 and the second electrode 164. In some such embodiments, the storage devices 158 individually comprise capacitors. However, the disclosure is not so limited and in other embodiments, the storage devices 158 may each individually comprise a different storage node structure.

The first electrode 162 may be formed of and include conductive material such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium), polysilicon, and other materials exhibiting electrical conductivity. In some embodiments, the first electrode 162 is formed of and includes titanium nitride.

The second electrode 164 may be formed of and include conductive material. The second electrode 164 may, for example, be formed of and include one or more of the materials described above with reference to the first electrode 162. In some embodiments, the second electrode 164 has substantially the same material composition as the first electrode 162.

The dielectric material 166 may be formed of and include one or more dielectric materials, such as one or more of silicon dioxide ($SiO_2$), silicon nitride ($Si_3N_4$), polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT)), and a high-K dielectric material.

Each storage device 158 may be configured to be in electrical communication (e.g., by means of one or both of the first routing structures 148 and the second routing structures 150, and one or both of the first conductive contact structures 144 and the second conductive contact structures 146) with two of the transistor structures 142. In some embodiments, an individual storage device 158 is configured to be in electrical communication with two (2) of the first transistor structures 142A (and, therefore, two (2) of the first routing structures 148 and two (2) of the first conductive contact structures 144) or two (2) of the second transistor structures 142B (and, therefore, two (2) of the second routing structures 150 and two (2) of the second conductive contact structures 146) to form a memory cell 160. In some such embodiments, the transistor structures 142 of a memory cell 160 are horizontally offset (e.g., in the Y-direction) from one another and substantially vertically aligned (e.g., in the Z-direction) with one another. In some embodiments, first transistor structures 142A and second transistor structures 142B horizontally overlapping (e.g., in the X-direction, in the Y-direction) one another and vertically offset (e.g., in the Z-direction) from one another are components of different memory cells 160 than one another.

In some embodiments, each storage device 158 (and, therefore, each corresponding memory cell 160 including the storage device 158) includes a first electrode 162 configured to be in electrical communication with one of the transistor structures 142 and a second electrode 164 configured to be in electrical communication with another one of the transistor structures 142. In some such embodiments, each electrode of an individual storage device 158 is configured to be in electrical communication with a different one of the transistor structures 142 (e.g., different ones of the first transistor structures 142A or different ones of the second transistor structures 142B).

The storage devices 158 may be formed within an eighth insulative material 168 to electrically isolate the storage devices 158 from one another. The eighth insulative material 168 may be formed of and include insulative material, such as one or more of the materials described above with reference to the first insulative material 110. In some embodiments, the eighth insulative material 168 comprises dielectric oxide material, such as $SiO_x$ (e.g., $SiO_2$).

With reference to FIG. 1H, within the peripheral regions 103, capacitor structures 170 may be formed vertically over (e.g., in the Z-direction) the additional vertical stack structures 156. In some embodiments, the capacitor structures 170 are similar to the storage devices 158 within the array regions 101 (FIG. 1D). For example, each capacitor structure 170 may include a first electrode 162, a second electrode 164, and a dielectric material 166 between the first electrode 162 and the second electrode 164, as described above with reference to the storage devices 158 (FIG. 1G). However, the geometric configurations (e.g., shapes, sizes) of the first electrode 162, the second electrode 164, and the dielectric material 166 of a respective capacitor structure 170 may be different than those of a respective storage device 158 (FIG. 1G).

In some embodiments, a conductive plate structure 161 comprising the material of the first electrode 162 horizontally extends (e.g., in the X-direction, in the Y-direction) between horizontally neighboring (e.g., in the Y-direction) columns 163 of the capacitor structure 170. As described in further detail herein, the capacitor structures 170 may comprise decoupling capacitors for a microelectronic device (e.g., microelectronic device 300 (FIG. 3D through FIG. 3F)) subsequently formed from the first microelectronic device structure 100.

Figure 1I:
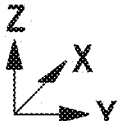
Figure 1J:
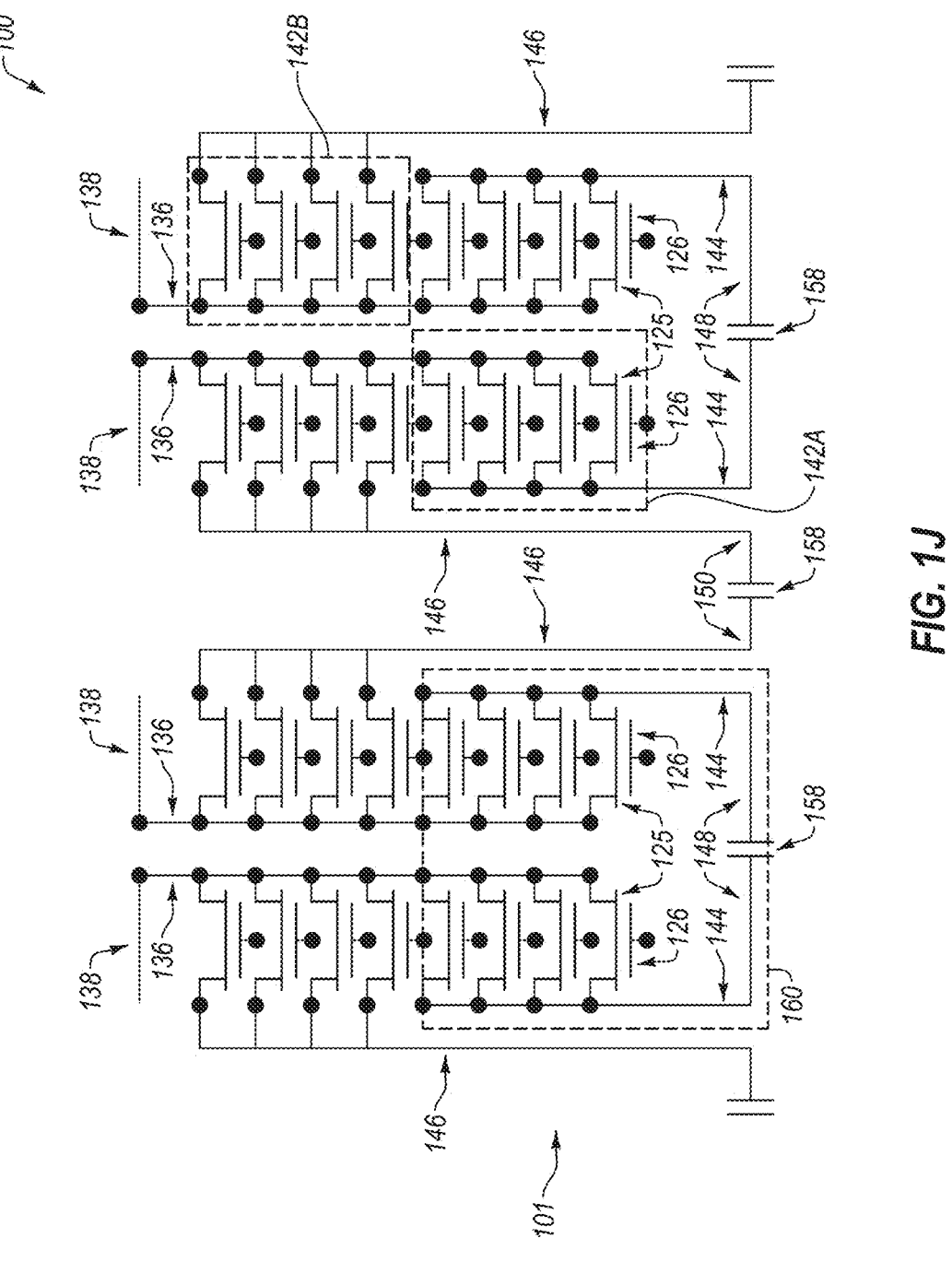
Figure 1K:
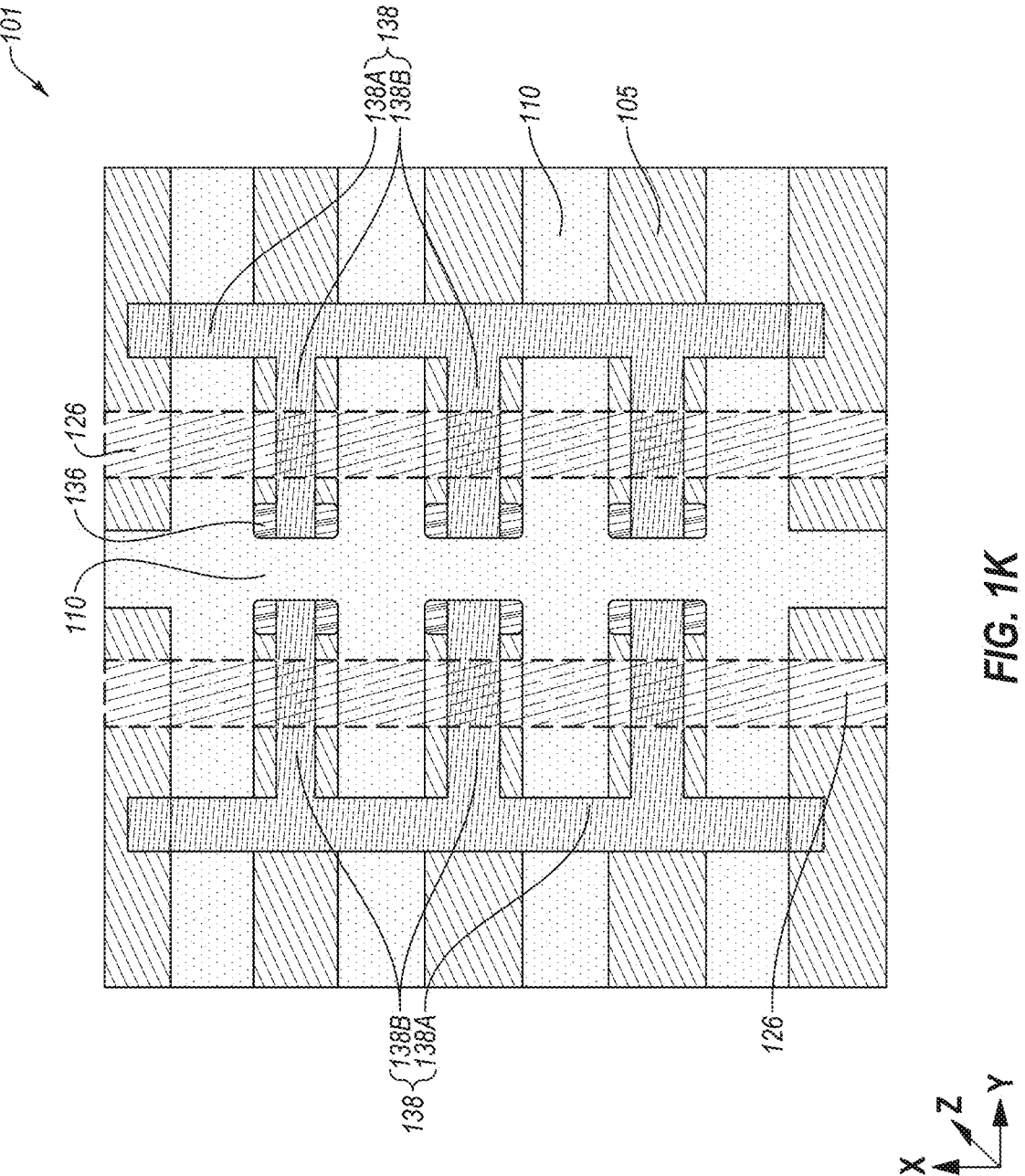
Figure 1L:
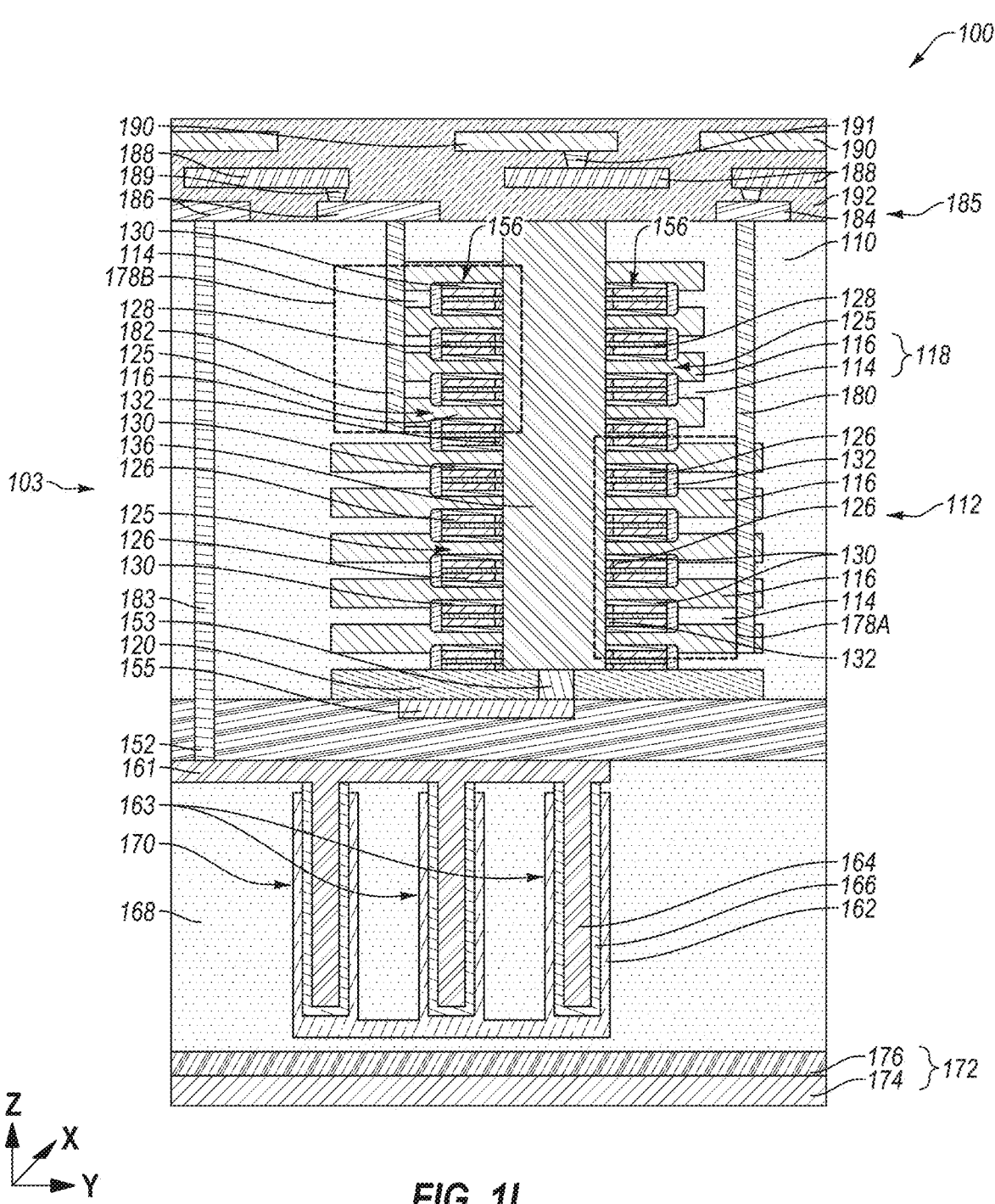
Figure 1M:
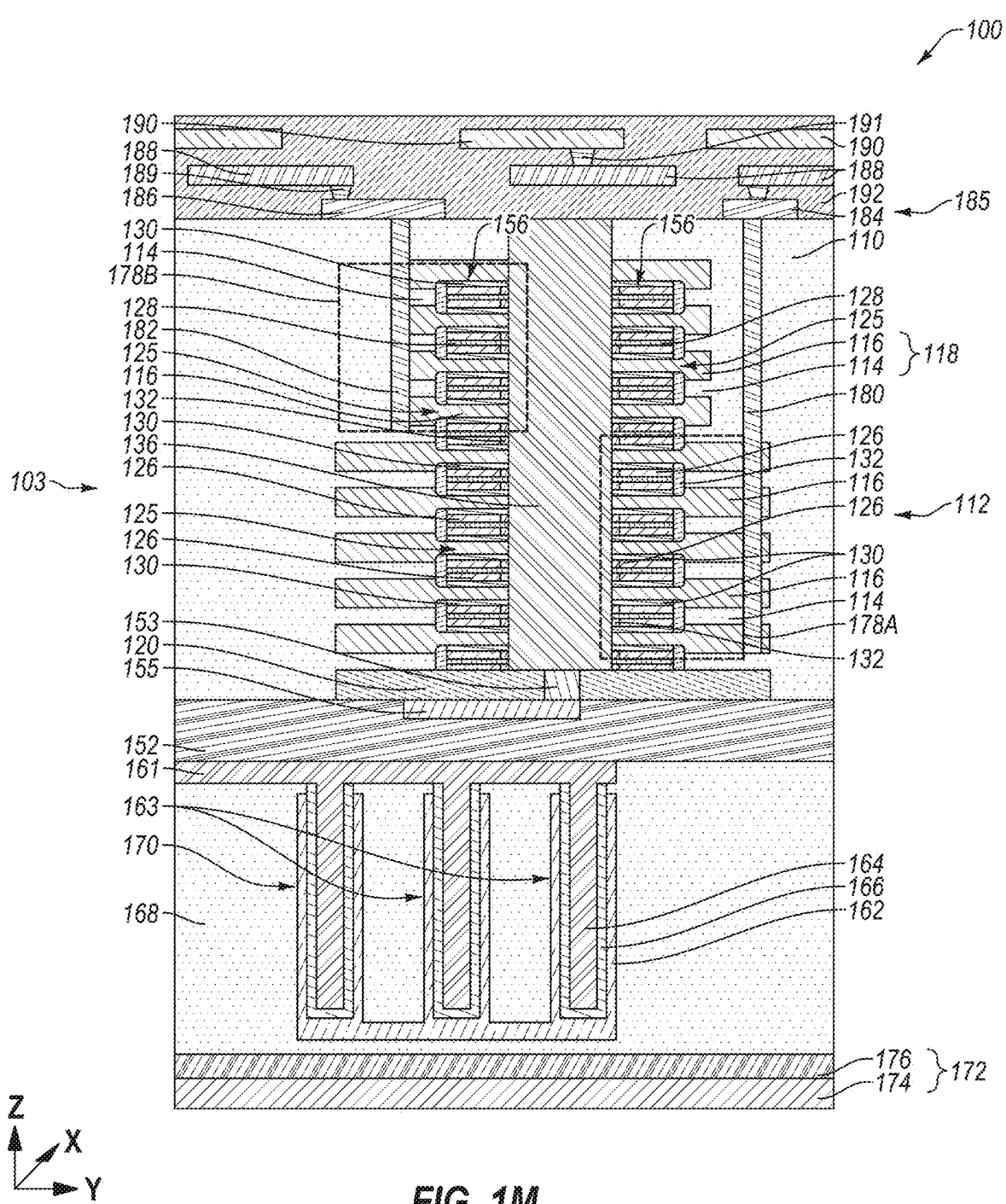

FIG. 1I through FIG. 1M are simplified, partial vertical cross-sectional views (FIG. 1I, FIG. 1L, and FIG. 1M), a simplified, partial electrical schematic view (FIG. 1J), and a simplified, partial horizontal cross-sectional view (FIG. 1K) of the first microelectronic device structure 100 at a processing stage subsequent to that illustrated in FIG. 1G and FIG. 1H. The simplified, partial vertical cross-sectional view of FIG. 1I is taken through the same plane as the cross-sectional view of FIG. 1G, but at a processing stage subsequent to that illustrated in FIG. 1G. The simplified, partial electrical schematic view of FIG. 1J corresponds to the portion of the first microelectronic device structure 100 depicted in FIG. 1I, with some features shown in the simplified, partial vertical cross-sectional view of FIG. 1I not depicted in the simplified, partial electrical schematic view of FIG. 1J for clarity and ease of understanding the drawings and associated description. The simplified, partial horizontal cross-sectional view of FIG. 1K is about line G-G depicted in the FIG. 1I. The simplified, partial vertical cross-sectional view of FIG. 1L is taken through the same plane as the cross-sectional view of FIG. 1H, but at a processing stage subsequent to that illustrated in FIG. 1H. The simplified, partial vertical cross-sectional view of FIG. 1M is taken through a portion of the peripheral region 103 opposite the simplified, partial vertical cross-sectional view of FIG. 1I.

Referring collectively to FIG. 1I, FIG. 1L, and FIG. 1M, after forming the storage devices 158 to form the memory cells 160 and the capacitor structures 170, a carrier wafer 172 comprising a second base structure 174 and an oxide material 176 may be formed over the first microelectronic device structure 100, such as over the storage devices 158 and the capacitor structures 170. The carrier wafer 172 may be configured to facilitate safe handling of the first microelectronic device structure 100 for further processing of the first microelectronic device structure 100. The carrier wafer 172 may comprise a conventional carrier structure and is, therefore, not described in detail herein.

The oxide material 176 may be formed of and include one or more of silicon oxide ($SiO_x$), phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$. In some embodiments, the eighth insulative material 168 comprises $SiO_x$ (e.g., $SiO_2$). The oxide material 176 and the seventh insulative material 152 may have substantially the same material composition as one another.

The carrier wafer 172 may be attached to the first microelectronic device structure 100 by contacting the eighth insulative material 168 of the first microelectronic device structure 100 with the oxide material 176 of the carrier wafer 172. After the eighth insulative material 168 and the oxide material 176 are in contact, the first microelectronic device structure 100 and the carrier wafer 172 may be exposed to annealing conditions to form bonds (e.g., oxide-to-oxide bonds) between the eighth insulative material 168 of the first microelectronic device structure 100 and the oxide material 176 of the carrier wafer 172 to form a microelectronic device structure assembly. In some embodiments, the first microelectronic device structure 100 and the carrier wafer 172 are exposed to a temperature greater than, for example, 800° C., to form the oxide-to-oxide bonds and attach the first microelectronic device structure 100 to the carrier wafer 172.

After attaching the carrier wafer 172 to the first microelectronic device structure 100, the carrier wafer 172 and the first microelectronic device structure 100 may be vertically inverted (e.g., in the Z-direction) (e.g., flipped) and the first base structure 102 (FIGS. 1G and 1H) may be removed, such as by exposing the first base structure 102 to a chemical mechanical planarization (CMP) process.

With collective reference to FIG. 1L and FIG. 1M, after vertically inverting (e.g., in the Z-direction) the first microelectronic device structure 100 and removing the first base structure 102 (FIGS. 1G and 1H), horizontally extending (e.g., in the Y-direction) portions of now vertically upper (e.g., in the Z-direction) levels of the tiers 118 of the semiconductive material 116 (e.g., in the orientation illustrated in FIG. 1L and FIG. 1M; e.g., vertical levels of the semiconductive material 116 that are relatively farther from the capacitor structures 170 than other vertical levels of the semiconductive material 116) of the channel regions 125 within the peripheral regions 103 may be removed. Removal of the portions of the tiers 118 of the second insulative material 114 and the semiconductive material 116 of the channel regions 125 of the now vertically upper (e.g., in the Z-direction) tiers 118 may form upper channel regions 125 within the peripheral regions 103 having a relatively smaller horizontal dimension (e.g., in the Y-direction) than the channel regions 125 of now relatively vertically lower (e.g., in the Z-direction) tiers 118 within the peripheral regions 103.

The channel regions 125 within the peripheral regions 103 may form first additional transistor structures 178A and second additional transistor structures 178B. The first additional transistor structures 178A may be similar to but vertically offset (e.g., in the Z-direction) from the first transistor structures 142A (FIG. 1I) of the array region 101 (FIG. 1I). The second additional transistor structures 178B may be similar to but vertically offset (e.g., in the Z-direction) from as the second transistor structures 142B (FIG. 1I) of the array region 101 (FIG. 1I). Each of the first additional transistor structures 178A and the second additional transistor structures 178B may individually include four vertically spaced (e.g., in the Z-direction) levels of channel regions 125. In additional embodiments, the first additional transistor structures 178A further includes an additional channel region 125 relative to the second additional transistor structures 178B. The first additional transistor structures 178A and the second additional transistor structures 178B are collectively referred to herein as "additional transistor structures 178." The additional transistor structures 178 may be employed within sub word line driver (SWD) circuitry within horizontal areas of the peripheral regions 103. In some embodiments, the additional transistor structures 178 individually have one of a G2S configuration, a G3S configuration, and a GAA configuration, such that multiple boundaries of individual channel regions 125 thereof are at least partially covered (e.g., surrounded) by the first conductive structures 126.

After removing the portions of the now vertically upper (e.g., in the Z-direction) tiers 118 of the second insulative material 114 and the semiconductive material 116 within the peripheral regions 103 to form the first additional transistor structures 178A having a relatively smaller horizontal dimension (e.g., in the Y-direction) than the second additional transistor structures 178B, the openings may be filled with insulative material, such as one or more of the materials described above with reference to the first insulative material 110. Since the openings are filled with insulative material that may be the same as the first insulative material 110, the insulative material filling the openings is illustrated in FIG. 1L and FIG. 1M as the same as the first insulative material 110.

Still referring to FIG. 1L and FIG. 1M, third conductive contact structures 180 may be formed to vertically extend (e.g., in the Z-direction) through the first microelectronic device structure 100 within the peripheral regions 103 and contact the channel regions 125 of the first additional transistor structures 178A. In addition, fourth conductive contact structures 182 may be formed to vertically extend (e.g., in the Z-direction) through the first microelectronic device structure 100 within the peripheral regions 103 and contact the channel regions 125 of the second additional transistor structures 178B.

With reference to FIG. 1L, one or more fifth conductive contact structures 183 may be formed to vertically extend (e.g., in the Z-direction) through the first insulative material 110 and contact with (e.g., in electrical communication with) the conductive plate structure 161 within at least one of the peripheral regions 103. As shown in FIG. 1M, the fifth conductive contact structures 183 may be omitted (e.g., not formed within) one or more other of the peripheral regions 103.

After forming the third conductive contact structures 180 and the fourth conductive contact structures 182, a conductive routing tier 185 may be formed over the stack structure 112. As shown in FIG. 1L and FIG. 1M, within the peripheral regions 103 the conductive routing tier 185 may be formed to include third routing structures 184 and fourth routing structures 186. The third routing structures 184 may be formed to contact (e.g., electrically contact) the third conductive contact structures 180. The fourth routing structures 186 may be formed to contact (e.g., in electrically contact) the fourth conductive contact structures 182.

Referring to FIG. 1I, within the array regions 101, the conductive routing tier 185 may be formed to include additional conductive structures 138 (e.g., digit lines, bit lines). An individual additional conductive structure 138 may be formed to contact (e.g., electrically contact) a respective group of the conductive pillar structures 136 (e.g., digit line contact structures, BITCON structures) within a respective array region 101. As shown in FIG. 1I, different additional conductive structures 138 may be horizontally offset from one another (e.g., in the Y-direction), and may be coupled to different groups of the conductive pillar structures 136 than one another. The additional conductive structures 138 within the array regions 101 may be substantially vertically aligned (e.g., in the Z-direction) with the third routing structures 184 (FIG. 1L and FIG. 1M) and the fourth routing structures 186 (FIG. 1L and FIG. 1M) within the peripheral regions 103 (FIG. 1L and FIG. 1M).

Referring to FIG. 1K, which shows a simplified, partial horizontal cross-sectional view of the first microelectronic device structure 100 about line G-G depicted in the 1I, the additional conductive structures 138 may individually be formed to include a first section 138A, and multiple second sections 138B individually horizontally protruding from and continuous with the first section 138A. The first sections 138A of the additional conductive structures 138 may substantially linearly horizontally extend in the substantially the same direction (e.g., the X-direction) as one another and the conductive structures 126 vertically thereunder. The first sections 138A of the additional conductive structures 138 may horizontally extend (e.g., the X-direction) in parallel with one another and the conductive structures 126. In FIG. 1K, some of the conductive structures 126 are depicted using dashed lines to identify that the conductive structures 126 vertical underlie (e.g., in the Z-direction) the additional conductive structures 138. The second sections 138B of the additional conductive structures 138 may substantially linearly horizontally extend orthogonal to (e.g., in the Y-direction) the conductive structures 126 and the first sections 138A of the additional conductive structures 138. Each additional conductive structures 138 may, for example, include a single (e.g., only one) first section 138A extending in the X-direction, and multiple (e.g., more than one) second sections 138B integral with the first section 138A and extending in the Y-direction. Each second section 138B of an individual additional conductive structure 138 may horizontally extend (e.g., in the Y-direction) from the first section 138A to one of the conductive pillar structures 136. In FIG. 1K, some of the conductive pillar structures 136 are depicted using dashed lines to identify that the conductive pillar structures 136 vertical underlie (e.g., in the Z-direction) the additional conductive structures 138. An individual second section 138B of the additional conductive structure 138 may horizontally overlap (e.g., in the Y-direction) an individual conductive pillar structure 136, and may couple the additional conductive structure 138 to the conductive pillar structure 136. An individual additional conductive structure 138 may be coupled to multiple (e.g., a group) of conductive pillar structures 136 by way of multiple second sections 138B of the additional conductive structure 138. The configurations of the additional conductive structures 138 may facilitate reduced horizontal footprint and/or enhanced feature densities, as compared to conventional configurations.

With collective reference to FIG. 1I through FIG. 1M, the third conductive contact structures 180, the fourth conductive contact structures 182, the fifth conductive contact structures 183, the additional conductive structures 138, the third routing structures 184, and the fourth routing structures 186 may individually be formed of and include conductive material, such as one or more of the materials described above with reference to the conductive structures 126. In some embodiments, the third conductive contact structures 180, the fourth conductive contact structures 182, the fifth conductive contact structures 183, additional conductive structures 138, the third routing structures 184, and the fourth routing structures 186 individually comprise metallic material, such as tungsten.

After forming the third conductive contact structures 180 (FIG. 1L and FIG. 1M), the fourth conductive contact structures 182 (FIG. 1L and FIG. 1M), and the conductive routing tier 185 (including the third routing structures 184 (FIG. 1L and FIG. 1M)), the fourth routing structures 186 (FIG. 1L and FIG. 1M), and the additional conductive structures 138 (FIG. 1I through FIG. 1K), one or more additional routing tiers may be formed over the conductive routing tier 185. For example, fifth routing structures 188 may be formed over the conductive routing tier 185, such as over the additional conductive structures 138 (FIG. 1I through FIG. 1K) within the array region 101 (FIG. 1I through FIG. 1K) and over the third routing structures 184 (FIG. 1L and FIG. 1M), the fourth routing structures 186 (FIG. 1L and FIG. 1M) in the peripheral regions 103 (FIG. 1L and FIG. 1M). At least some of the fifth routing structures 188 may be electrically connected to at least some of the components of the conductive routing tier 185 (including the third routing structures 184 (FIG. 1L and FIG. 1M), the fourth routing structures 186 (FIG. 1L and FIG. 1M), and the additional conductive structures 138 (FIG. 1I through FIG. 1K)) by way of conductive interconnect structures 189. In addition, optionally, sixth routing structures 190 may be formed over the fifth routing structures 188. At least some of the sixth routing structures 190 (if any) may be electrically connected to at least some of the fifth routing structures 188 by way of additional conductive interconnect structures 191. The fifth routing structures 188, the conductive interconnect structures 189, the sixth routing structures 190 (if any), and the additional conductive interconnect structures 191 (if any) may be formed within a ninth insulative material 192.

The fifth routing structures 188, the conductive interconnect structures 189, the sixth routing structures 190 (if any), and the additional conductive interconnect structures 191 (if any) may individually be formed of and include conductive material, such as one or more of the materials described above with reference to the conductive structures 126. In some embodiments, the fifth routing structures 188, the conductive interconnect structures 189, the sixth routing structures 190, and the additional conductive interconnect structures 191 individually comprise metallic material, such as tungsten.

The ninth insulative material 192 may be formed of and include insulative material, such as one or more of the materials described above with reference to the first insulative material 110. In some embodiments, the ninth insulative material 192 is formed of and includes dielectric oxide material, such as $SiO_x$ (e.g., $SiO_2$).

Figure 2A:
FIG. 2A through FIG. 2G are a simplified, partial top-down view (FIG. 2A) and simplified, partial vertical cross-sectional views (FIG. 2B through FIG. 2G) illustrating a method of forming a second microelectronic device structure, in accordance with embodiments of the disclosure.
Figure 2B:
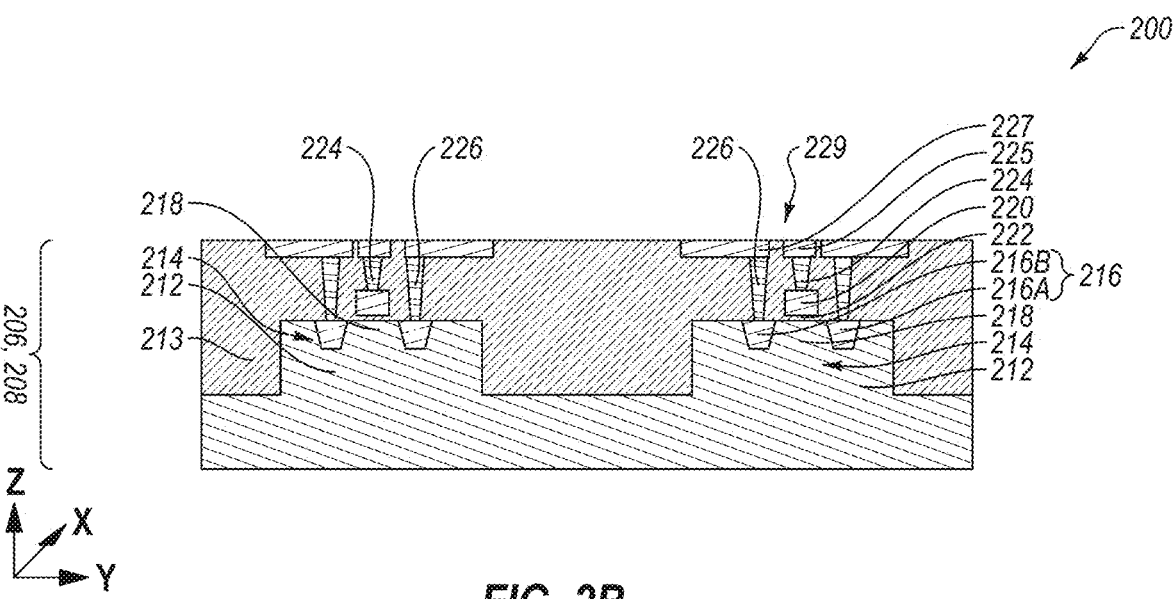
Figure 2C:
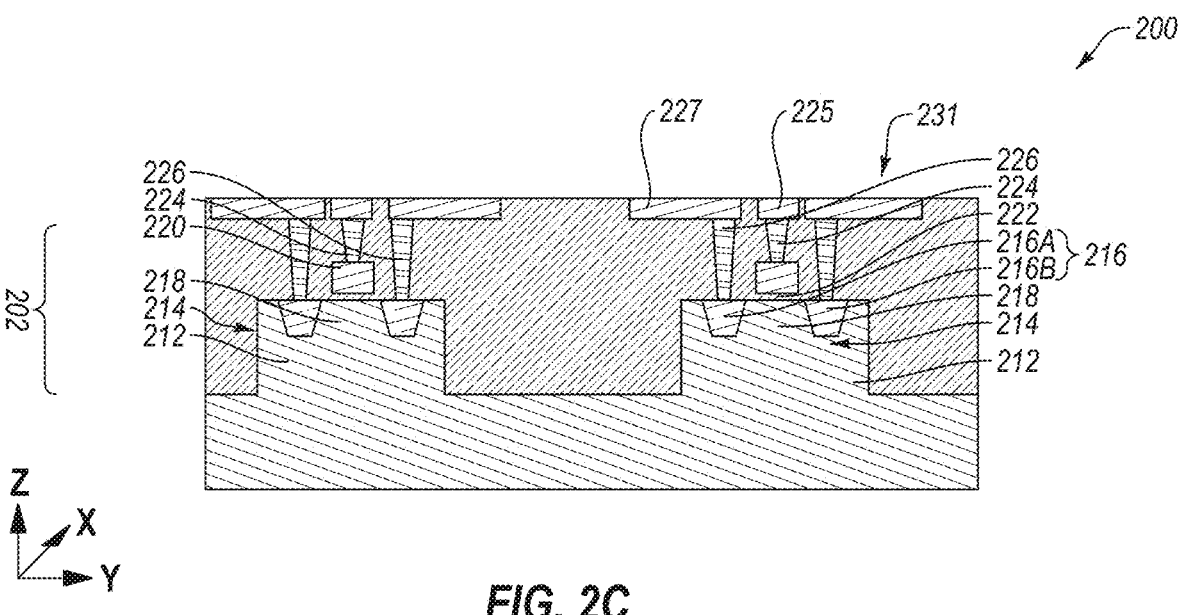
Figure 2D:
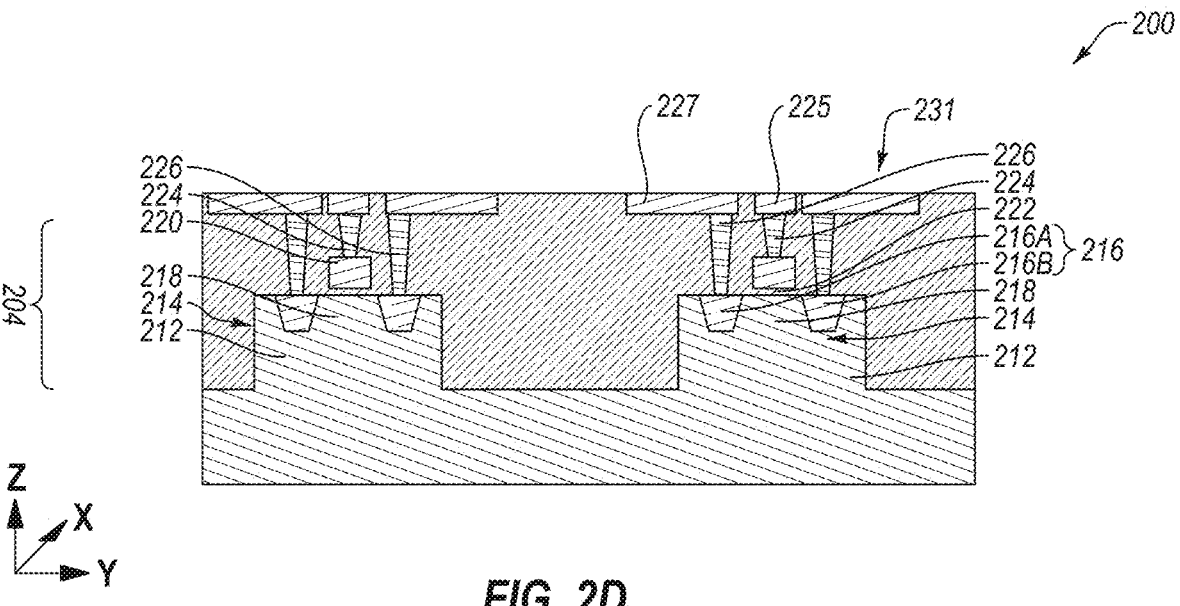

FIG. 2A is a simplified, partial top-down view of a second microelectronic device structure 200, in accordance with embodiments of the disclosure. FIG. 2B is a simplified, partial vertical cross-sectional view of the second microelectronic device structure 200 taken through section line B-B of FIG. 2A. FIG. 2C is a simplified, partial vertical cross-sectional view of the second microelectronic device structure 200 taken through each of the section lines C-C of FIG. 2A. FIG. 2D is a simplified, partial vertical cross-sectional view of the second microelectronic device structure 200 taken through each of the section lines D-D of FIG. 2A.

With reference to FIG. 2A, the second microelectronic device structure 200 includes a socket region 202 configured to include one or more conductive interconnects for electrically connecting one or more components of the first microelectronic device structure 100 to a back end of line (BEOL) structure; a complementary metal oxide semiconductor (CMOS) region 204 including one or more CMOS circuits; sense amplifier regions 206 including sense amplifier (SA) circuits configured to facilitate operations of the memory cells 160 (FIG. 1I) of the first microelectronic device structure 100 (FIG. 1I); a conductive line socket region 208 (e.g., digit line socket region, bit line socket region) configured to include conductive interconnects for electrically connecting the conductive structures 138 (FIG. 1I) of the first microelectronic device structure 100 (FIG. 1I) to the sense amplifier circuits of the sense amplifier regions 206. The sense amplifier regions 206 may also include minigap regions 210 including additional conductive interconnects operatively associated with the sense amplifier circuits and/or additional control logic circuitry (e.g., additional CMOS circuitry) within the sense amplifier regions 206.

In some embodiments, the sense amplifier regions 206 are horizontally interposed (e.g., in the X-direction) between the socket region 202 and the CMOS region 204. The conductive line socket regions 208 may respectively be horizontally interposed (e.g., in the X-direction, in the Y-direction) between horizontally neighboring (e.g., in the X-direction, in the Y-direction) sense amplifier regions 206. In some embodiments, and as described in further detail herein, after attaching the second microelectronic device structure 200 to the first microelectronic device structure 100 (FIGS. 1I through 1L), the sense amplifier regions 206 and the conductive line socket region 208 may be located within horizontal boundaries (e.g., in the X-direction, in the Y-direction) of the array region 101 (FIG. 1I); and the socket region 202 and the CMOS region 204 may be located within horizontal boundaries (e.g., in the X-direction, in the Y-direction) of the peripheral regions 103 (FIGS. 1K and 1L) of the first microelectronic device structure 100 (FIGS. 1I through 1L).

With collective reference to FIG. 2B through FIG. 2D, within each of the socket regions 202, the CMOS region 204, and the sense amplifier regions 206, the second microelectronic device structure 200 may be formed to include transistors 214 at least partially positioned within a second base structure 212. A tenth insulative material 213 may vertically overlie (e.g., in the Z-direction) the transistors 214. The transistors 214 may be included within and may form portions of control logic circuitry (e.g., CMOS circuitry), such as sense amplifier circuitry of sense amplifier regions 206, of the second microelectronic device structure 200.

The second base structure 212 may be formed of and include one or more of the materials described above with reference to the first base structure 102 (FIG. 1B). In some embodiments, the second base structure 212 is formed of and includes semiconductive material, such as silicon (e.g., monocrystalline silicon, polycrystalline silicon).

The tenth insulative material 213 may be formed of and include insulative material, such as one or more of the materials described above with reference to the first insulative material 110 (FIG. 1B). In some embodiments, the tenth insulative material 213 is formed of and includes dielectric oxide material, such as $SiO_x$ (e.g., $SiO_2$).

The transistors 214 may individually be formed to include conductively doped regions 216, a channel region 218, a gate structure 220, and a gate dielectric material 222. The conductive doped regions 216 may be formed within the second base structure 212; the channel region 218 may be formed within the second base structure 212 and may be horizontally interposed (e.g., in the Y-direction) between the conductive doped regions 216; the gate structure 220 may vertically overlie (e.g., in the Z-direction) the channel region 218; and the gate dielectric material 222 (e.g., a dielectric oxide material) may be vertically interposed (e.g., in the Z-direction) between the gate structure 220 and the channel region 218. The conductively doped regions 216 of an individual transistor 214 may include a source region 216A and a drain region 216B, collectively referred to herein as conductively doped regions 216.

For an individual transistor 214, the conductively doped regions 216 thereof may include semiconductor material of the second base structure 212 doped with one or more desired conductivity enhancing species. In some embodiments, the conductively doped regions 216 of the transistor 214 comprise semiconductor material (e.g., silicon) doped with at least one N-type dopant (e.g., one or more of phosphorus, arsenic, antimony, and bismuth). In some of such embodiments, the channel region 218 of the transistor 214 incudes the semiconductor material doped with at least one P-type dopant (e.g., one or more of boron, aluminum, and gallium). In some other of such embodiments, the channel region 218 of the transistor 214 comprises substantially undoped semiconductor material (e.g., substantially undoped silicon). In additional embodiments, for an individual transistor 214, the conductively doped regions 216 thereof comprise semiconductor material (e.g., silicon) doped with at least one P-type dopant (e.g., one or more of boron, aluminum, and gallium). In some of such additional embodiments, the channel region 218 of the transistor 214 comprises the semiconductor material doped with at least one N-type dopant (e.g., one or more of phosphorus, arsenic, antimony, and bismuth). In some other of such additional embodiments, the channel region 218 of the transistor 214 comprised substantially undoped semiconductor material (e.g., substantially undoped silicon).

The gate structures 220 (e.g., gate electrodes) may individually horizontally extend (e.g., in the X-direction) between and be employed by multiple transistors 214. The gate structures 220 may be formed of and include conductive material, such as one or more of the materials described above with reference to the conductive structures 126 (FIG. 1B).

With continued reference to FIG. 2B through FIG. 2D, first contact structures 224 may be formed over and in contact with the gate structures 220 (and, hence, the transistors 214), and seventh routing structures 225 may be formed over and in contact with the first contact structures 224. In addition, second contact structures 226 may be formed over and in contact with the conductively doped regions 216, and eighth routing structures 227 may be formed over and in contact with the second contact structures 226. Each of the first contact structures 224, the seventh routing structures 225, the second contact structures 226, and the eighth routing structures 227 may individually be formed of and include conductive material, such as one or more of the materials described above with reference to the conductive structures 126. In some embodiments, each of the first contact structures 224, the seventh routing structures 225, the second contact structures 226, and the eighth routing structures 227 individually comprise metallic material, such as tungsten.

The transistors 214, the first contact structures 224, the seventh routing structures 225, the second contact structures 226, and the eighth routing structures 227 may be used to form various control logic circuits (e.g., CMOS circuits) facilitating desirable control operations for the memory cells 160 (FIG. 1I). For example, within the sense amplifier regions 206, the aforementioned features may form and be included within sense amplifier circuits 229 (FIG. 2B) for use and operation of the memory cells 160 (FIG. 1I). As another example, within the CMOS region 204, the aforementioned features may form and be included within additional circuits 231 (FIG. 2C and FIG. 2D) (e.g., high level circuits) for operation of the memory cells 160 (FIG. 1I), such as one or more of driver (e.g., column driver(s), block switch(es), and voltage pump(s)) circuits, data path circuits, I/O circuits, charge pump (e.g., $V_{CCP}$ charge pump, $V_{NEGWL}$ charge pump, DVC2 charge pump) circuits, DLL circuits, $V_{dd}$ regulator circuits, string driver circuits, page buffer circuits, decoder (e.g., local deck decoder, column decoder) circuits, repair circuits (e.g., row repair circuits), memory test circuits, MUX circuits, ECC circuits, and self-refresh/wear leveling circuits, and various chip/deck control circuits.

Figure 2E:
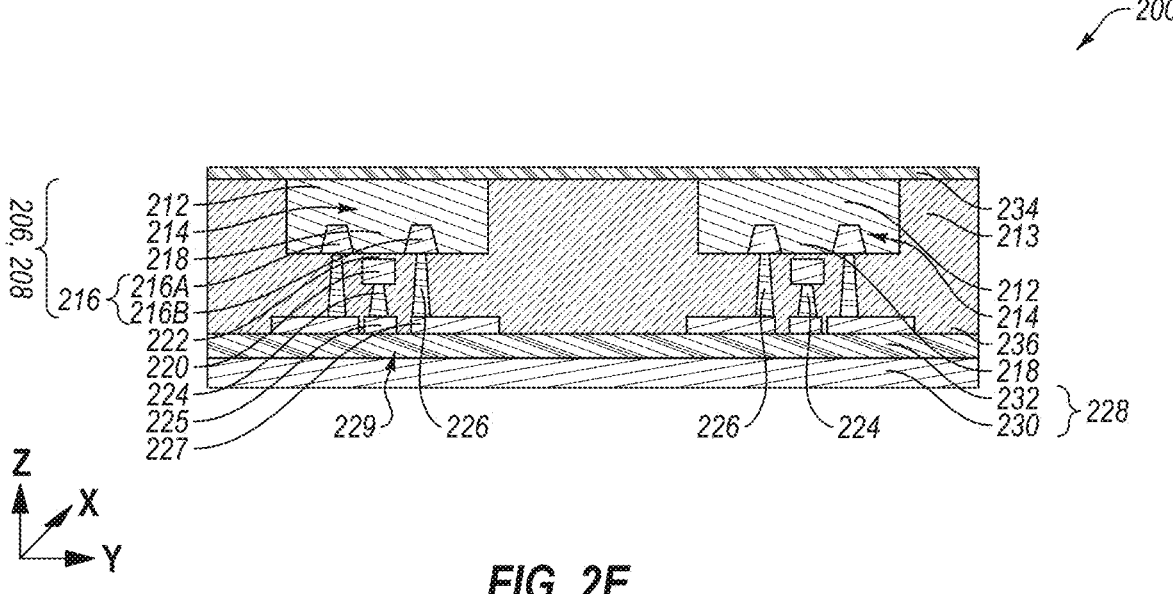
Figure 2F:
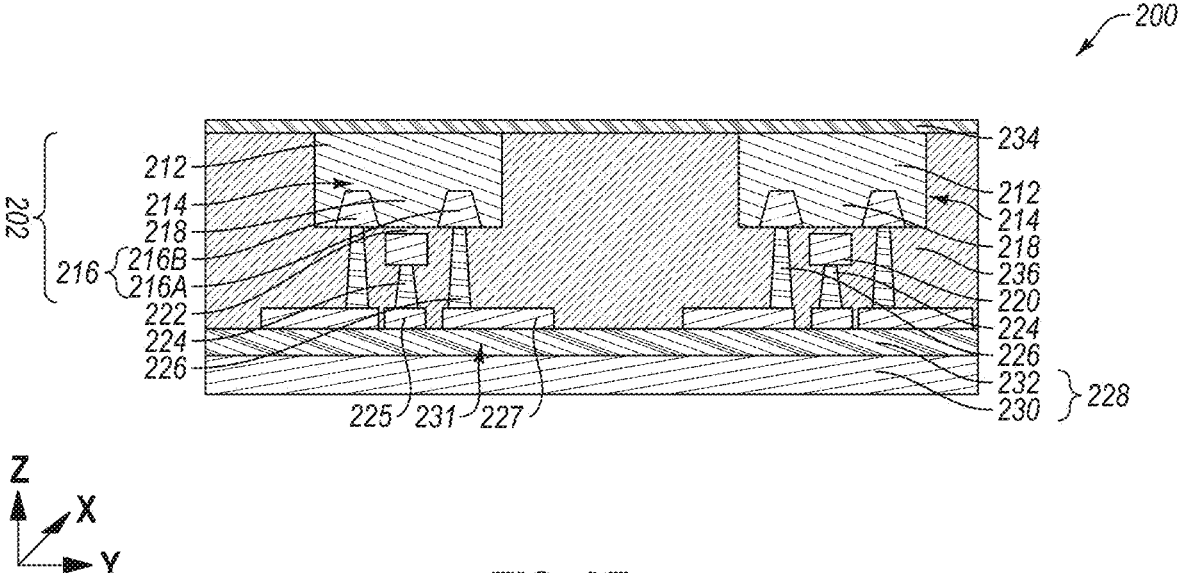
Figure 2G:
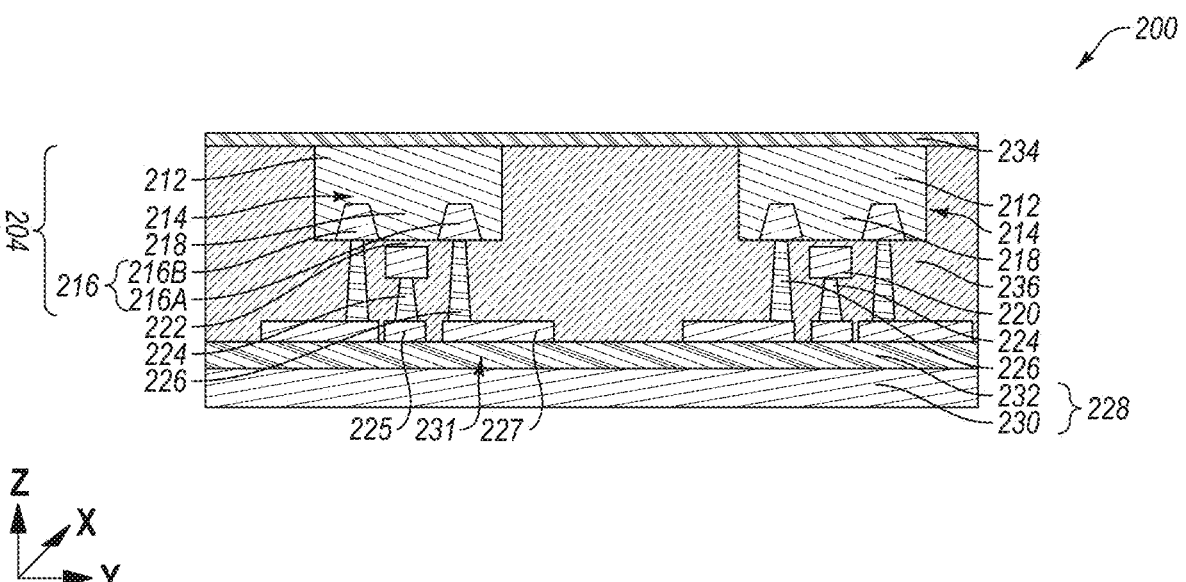

FIG. 2E through FIG. 2G are simplified, partial vertical cross-sectional view of the second microelectronic device structure 200 at a processing stage subsequent to that described with reference to FIG. 2A through FIG. 2D. FIG. 2E is taken through the same plane as that illustrated in FIG. 2B, but at a subsequent processing stage than that illustrated and described with reference to FIG. 2A through FIG. 2D. FIG. 2F is taken through the same plane as that illustrated in FIG. 2C, but at a subsequent processing stage than that illustrated and described with reference to FIG. 2A through FIG. 2D. FIG. 2G is taken through the same plane as that illustrated in FIG. 2D, but at a subsequent processing stage than that illustrated and described with reference to FIG. 2A through FIG. 2D.

With collective reference to FIG. 2E through FIG. 2G, a carrier wafer 228 including a third base structure 230 and oxide material 232 may be formed over the transistors 214 of the second microelectronic device structure 200. The carrier wafer 228 may be configured to facilitate safe handling of the second microelectronic device structure 200 for further processing of the second microelectronic device structure 200. The carrier wafer 228 may comprise a conventional carrier structure and is, therefore, not described in detail herein. The oxide material 232 may comprise one or more of the materials described above with reference to the oxide material 176 (FIG. 1I).

The carrier wafer 228 may be attached to the second microelectronic device structure 200 by contacting the tenth insulative material 213 of the second microelectronic device structure 200 with the oxide material 232 of the carrier wafer 228. After the tenth insulative material 213 and the oxide material 232 are in contact, the second microelectronic device structure 200 and the carrier wafer 228 may be exposed to annealing conditions to form bonds (e.g., oxide-to-oxide bonds) between the tenth insulative material 213 and the oxide material 232. In some embodiments, the tenth insulative material 213 and the oxide material 232 are exposed to a temperature greater than, for example, 800° C., to form the oxide-to-oxide bonds and attach the carrier wafer 228.

After attaching the carrier wafer 228, the resulting assembly may be vertically inverted (e.g., in the Z-direction) (e.g., flipped) and portions of the second base structure 212 (FIG. 2B through FIG. 2D) may be removed (e.g., vertically thinned), such as by exposing the second base structure 212 to a chemical mechanical planarization (CMP) process. Remaining portions of the second base structure 212 may be isolated from one another by remaining portions of the tenth insulative material 213.

After removing portions of the second base structure 212, an eleventh insulative material 234 may be formed on or over the remaining portions of the second base structure 212 and the tenth insulative material 213. The eleventh insulative material 234 may be formed of and include insulative material, such as one or more of the materials described above with reference to the first insulative material 110.

Figure 3A:
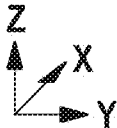
FIG. 3A through FIG. 3F are simplified, partial vertical cross-sectional views illustrating a method of forming a microelectronic device from the first microelectronic device structure and the second microelectronic device structure.
Figure 3B:
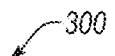
Figure 3C:
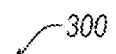

FIG. 3A through FIG. 3C are simplified, partial vertical cross-sectional views of a microelectronic device 300 formed by attaching the second microelectronic device structure 200 (FIG. 2E through FIG. 2G) to the first microelectronic device structure 100 (FIG. 1I through FIG. 1M). FIG. 3A illustrates the same plane as that illustrated in FIG. 1I and FIG. 2E, but after attachment of the second microelectronic device structure 200 to the first microelectronic device structure 100. FIG. 3B illustrates the same plane as that illustrated in FIG. 1L and FIG. 2F but after attachment of the second microelectronic device structure 200 to the first microelectronic device structure 100. FIG. 3C illustrates the same plane as that illustrated in FIG. 1M and FIG. 2G, but after attachment of the second microelectronic device structure 200 to the first microelectronic device structure 100.

With collective reference to FIG. 3A through FIG. 3C, the second microelectronic device structure 200 (FIG. 2E through FIG. 2G) may be vertically inverted (e.g., in the Z-direction) (e.g., flipped) and attached to the first microelectronic device structure 100 to form the microelectronic device 300 including the first microelectronic device structure 100 and the second microelectronic device structure 200.

With reference to FIG. 3A, the microelectronic device 300 includes the sense amplifier regions 206 and the conductive line socket regions 208 vertically overlying (e.g., in the Z-direction) and within a horizontal area of the array region 101. With reference to FIG. 3B and FIG. 3C, the microelectronic device 300 also includes the socket region 202 and the CMOS region 204 vertically over (e.g., in the Z-direction) and within horizontal areas of the peripheral regions 103.

Attaching the second microelectronic device structure 200 to the first microelectronic device structure 100 may include vertically inverting (e.g., in the Z-direction) the second microelectronic device structure 200 and contacting the ninth insulative material 192 of the first microelectronic device structure 100 with the tenth insulative material 213 of the second microelectronic device structure 200. Thereafter, the ninth insulative material 192 and the tenth insulative material 213 may be subjected to annealing conditions to form forming bonds (e.g., oxide-to-oxide bonds) between at least the ninth insulative material 192 and the tenth insulative material 213 and attach the second microelectronic device structure 200 to the first microelectronic device structure 100.

As shown in FIG. 3A through FIG. 3C, in some embodiments, the second microelectronic device structure 200 is attached to the first microelectronic device structure 100 such that a back side of the second microelectronic device structure 200 is attached to a front side of the first microelectronic device structure 100. A front side of the second microelectronic device structure 200 may be considered to be a side (e.g., end surface) most proximate to the transistors 214, and a back side of the second microelectronic device structure 200 may be considered to be an additional side (e.g., additional end surface) of the second microelectronic device structure 200 relatively more distal from the transistors 214 than the front side. In addition, a front side of the first microelectronic device structure 100 may be considered to be a side (e.g., end surface) most proximate to the transistor structures 142 of the memory cells 160, and a back side of the first microelectronic device structure 100 may be considered to be an additional side (e.g., additional end surface) of the first microelectronic device structure 100 most proximate to the storage devices 158 of the memory cells 160. Accordingly, in the configuration shown in FIG. 3A through FIG. 3C, the microelectronic device 300 may be formed to have a so-called "back-to-front" (B2F) arrangement of the second microelectronic device structure 200 relative to first microelectronic device structure 100.

In additional embodiments, the second microelectronic device structure 200 is attached to the first microelectronic device structure 100 such that the front side of the second microelectronic device structure 200 is attached to the front side of the first microelectronic device structure 100. In such embodiments, the orientation of the transistors 214 may be vertically inverted (e.g., flipped) relative to that shown in FIG. 3A through FIG. 3C. Thus, the transistors 214 may be vertically positioned relatively more proximate to the transistor structures 142 of the memory cells 160. As such, the microelectronic device 300 may be formed to have a so-called "front-to-front" (F2F) arrangement of the second microelectronic device structure 200 relative to first microelectronic device structure 100. An additional carrier structure may be employed to provide the second microelectronic device structure 200 in a F2F arrangement relative to the first microelectronic device structure 100.

Figure 3D:
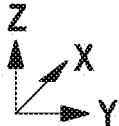
Figure 3E:
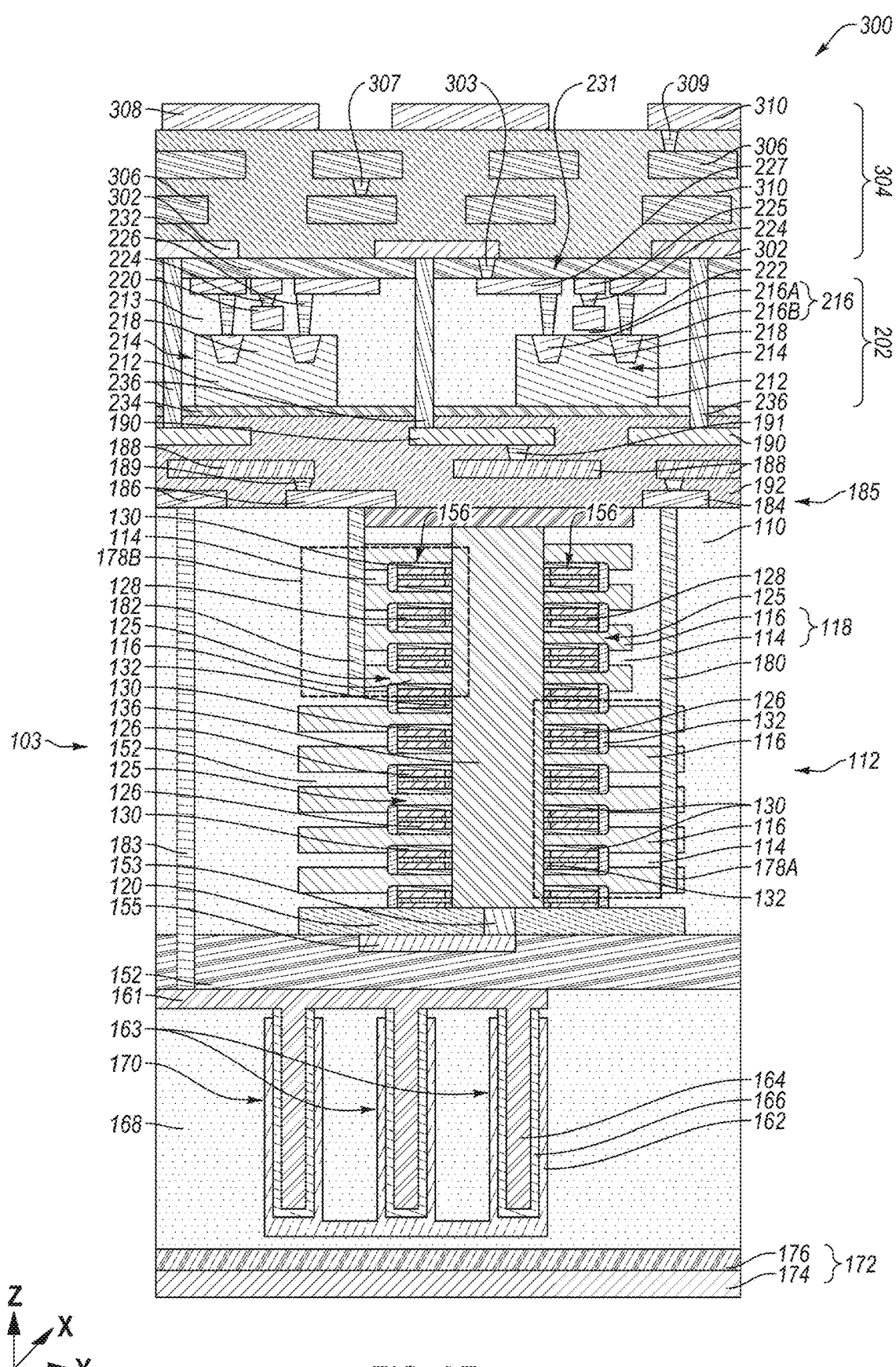
Figure 3F:
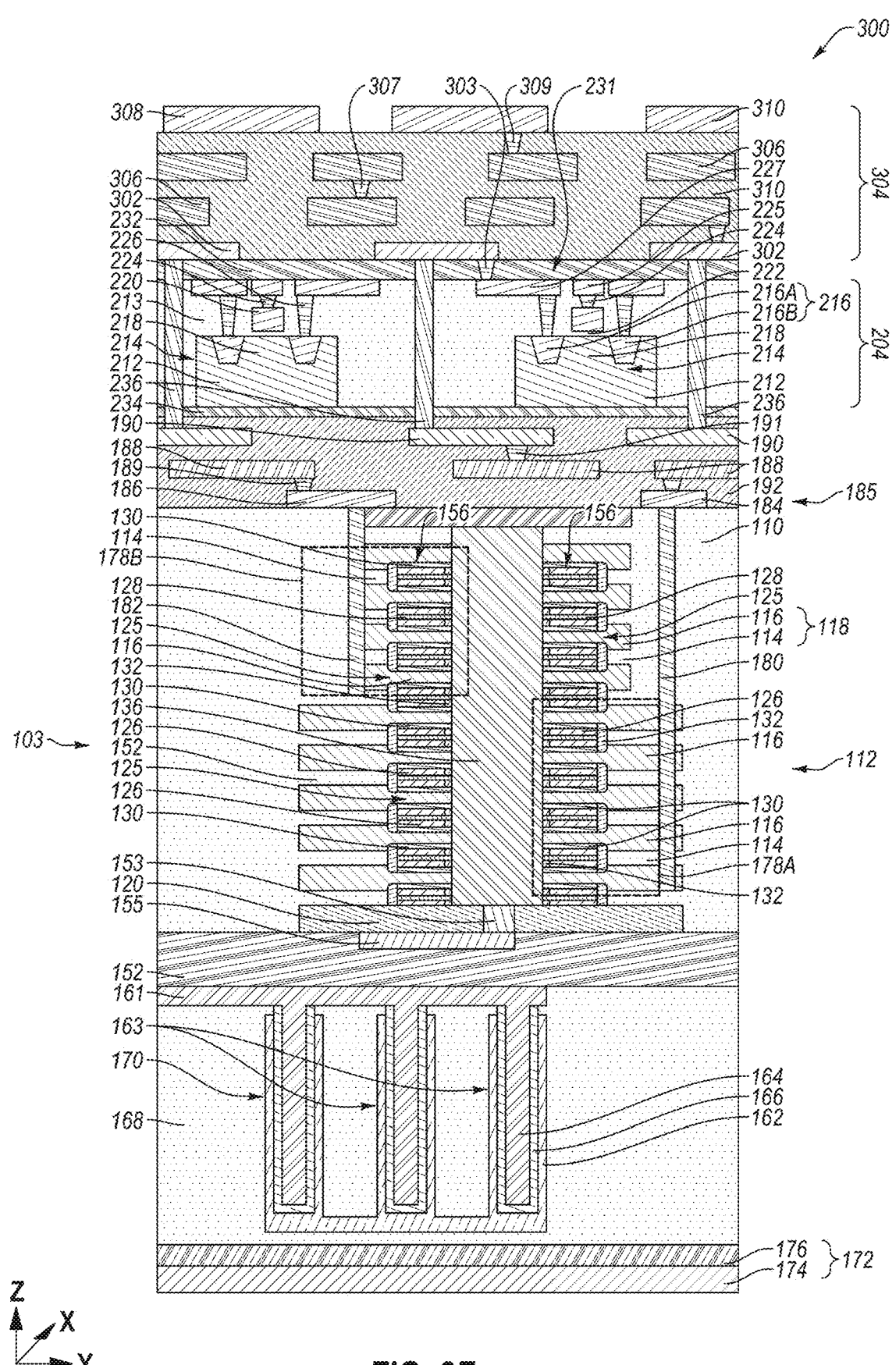

FIG. 3D through FIG. 3F are simplified, partial vertical cross-sectional views of the microelectronic device 300 at a processing stage subsequent to that illustrated in FIG. 3A through FIG. 3C. FIG. 3D illustrates the same plane as that illustrated in FIG. 3A, but at a processing stage subsequent to that illustrated in FIG. 3A through FIG. 3C. FIG. 3E illustrates the same plane as that illustrated in FIG. 3B, but at a processing stage subsequent to that illustrated in FIG. 3A through FIG. 3C. FIG. 3F illustrates the same plane as that illustrated in FIG. 3C, but at a processing stage subsequent to that illustrated in FIG. 3A through FIG. 3C.

With collective reference to FIG. 3D through FIG. 3F, after attaching the second microelectronic device structure 200 to the first microelectronic device structure 100, the third base structure 230 (FIG. 3A through FIG. 3C) of the carrier wafer 228 (FIG. 3A through FIG. 3C) may be removed (e.g., such as by CMP).

After removing the third base structure 230 (FIG. 3A through FIG. 3C) of the carrier wafer 228 (FIG. 3A through FIG. 3C), fifth conductive contact structures 236 may be formed to vertically extend (e.g., in the Z-direction) through the oxide material 232, the eleventh insulative material 234, and the ninth insulative material 192 and to or into the sixth routing structures 190. The fifth conductive contact structures 236 may individually be formed of and include conductive material, such as one or more of the materials described above with reference to the conductive structures 126 (FIG. 1I). In some embodiments, the fifth conductive contact structures 236 individually comprise metallic material, such as tungsten.

Following the formation of the fifth conductive contact structures 236, ninth routing structures 302 may be formed vertically over (e.g., in the Z-direction) and in contact with (e.g., in electrical communication with) the fifth conductive contact structures 236. In addition, conductive interconnect structures 303 may be formed to vertically extend (e.g., in the Z-direction) between and electrically connect the ninth routing structures 302 with at least some of the seventh routing structures 225 and/or at least some of the eighth routing structures 227 (and, hence, with at least some of the transistors 214, at least some of the sense amplifier circuits 229 (FIG. 3D), and at least some of the additional circuits 231 (FIG. 3E and FIG. 3F)).

After forming the ninth routing structures 302, a back end of line (BEOL) region 304 may be formed vertically thereover. The BEOL region 304 may include, for example, tenth routing structures 306, and conductive pad structures 308 vertically overlying (e.g., in the Z-direction) the tenth routing structures 306. Additional conductive interconnect structures 307 may be formed to vertically extend (e.g., in the Z-direction) between and electrically connect at least some of the tenth routing structures 306 with at least some of the ninth routing structures 302, and further conductive interconnect structures 309 may be formed to vertically extend (e.g., in the Z-direction) between and electrically connect at least some of the conductive pad structures 308 with at least some of the tenth routing structures 306.

The ninth routing structures 302, the conductive interconnect structures 303, the tenth routing structures 306, the additional conductive interconnect structures 307, the conductive pad structures 308, and the further conductive interconnect structures 309 may individually be formed of and include conductive material, such as one or more of the materials described above with reference to the conductive structures 126 (FIG. 1B). In some embodiments, the ninth routing structures 302, the conductive interconnect structures 303, the tenth routing structures 306, the additional conductive interconnect structures 307, the conductive pad structures 308, and the further conductive interconnect structures 309 may individually be formed of and include metallic material, such as tungsten.

The ninth routing structures 302, the conductive interconnect structures 303, the tenth routing structures 306, the additional conductive interconnect structures 307, the conductive pad structures 308, and the further conductive interconnect structures 309 vertically underlie a twelfth insulative material 310. The twelfth insulative material 310 is formed of and includes insulative material, such as one or more of the materials described with reference to the first insulative material 110. In some embodiments, the twelfth insulative material 310 is formed of and includes dielectric oxide material, such as $SiO_x$ (e.g., $SiO_2$).

Forming the microelectronic device 300 to include the sense amplifier regions 206 (including the sense amplifier circuits 229 thereof) vertically over (e.g., in the Z-direction) and within horizontal boundaries (e.g., in the X-direction, in the Y-direction) of the array region 101; and forming the microelectronic device 300 to include the socket region 202 and the CMOS region 204 vertically over (e.g., in the Z-direction) and within horizontal boundaries (e.g., in the X-direction, in the Y-direction) of the peripheral regions 103 facilitates placing advanced CMOS circuitry in a separate wafer (e.g., the second microelectronic device structure 200) than the memory cells 160 of the array region 101, which are formed within the first microelectronic device structure 100. In addition, forming at least some of the CMOS circuitry (e.g., the sense amplifier circuits 229 of the sense amplifier regions 206, the additional circuits 231 of the CMOS region 204) in a separate wafer than the memory cells 160 and vertically overlying (e.g., in the Z-direction) the wafer in which the memory cells 160 are formed facilitates forming the microelectronic device 300 to include a greater density of memory cells 160 compared to conventional microelectronic devices.

Thus, in accordance with some embodiments of the disclosure, a microelectronic device includes a first die and a second die vertically overlying and attached to the first die. The first die includes an array region and a peripheral region horizontally neighboring the array region. The array region includes memory cells respectively including a first transistor structure, a second transistor structure horizontally neighboring the first transistor structure, and a storage device vertically underlying and coupled to the first transistor structure and the second transistor structure. The peripheral region includes sub word line driver circuitry configured to effectuate control operations for the memory cells. The second die includes sense amplifier regions and a CMOS region horizontally neighboring some of the sense amplifier regions. The sense amplifier regions are within a horizontal area of the array region of the first die and include sense amplifier circuitry configured to effectuate additional control operations for the memory cells. The CMOS region horizontally neighbors some of the sense amplifier regions and includes CMOS circuitry configured to effectuate further control operations of the memory cells.

Furthermore, in accordance with some embodiments of the disclosure, a memory device includes a first microelectronic device structure and a second microelectronic device structure bonded to the first microelectronic device structure. The first microelectronic device structure includes an array of memory cells, each of the memory cells of the array of memory cells respectively including a transistor including four vertically stacked channel regions, an additional transistor comprising four additional vertically stacked channel regions, and a capacitor vertically overlying the first transistor and the second transistor and in electrical communication with each of the transistor and the additional transistor. The first microelectronic device structure further includes a peripheral region horizontally neighboring the array of memory cells and including sub word line driver (SWD) circuits individually including a further transistor comprising four further vertically stacked channel regions. The second microelectronic device structure includes sense amplifier (SA) circuits vertically overlying and within horizontal boundaries of the array of memory cells.

Figure 4:
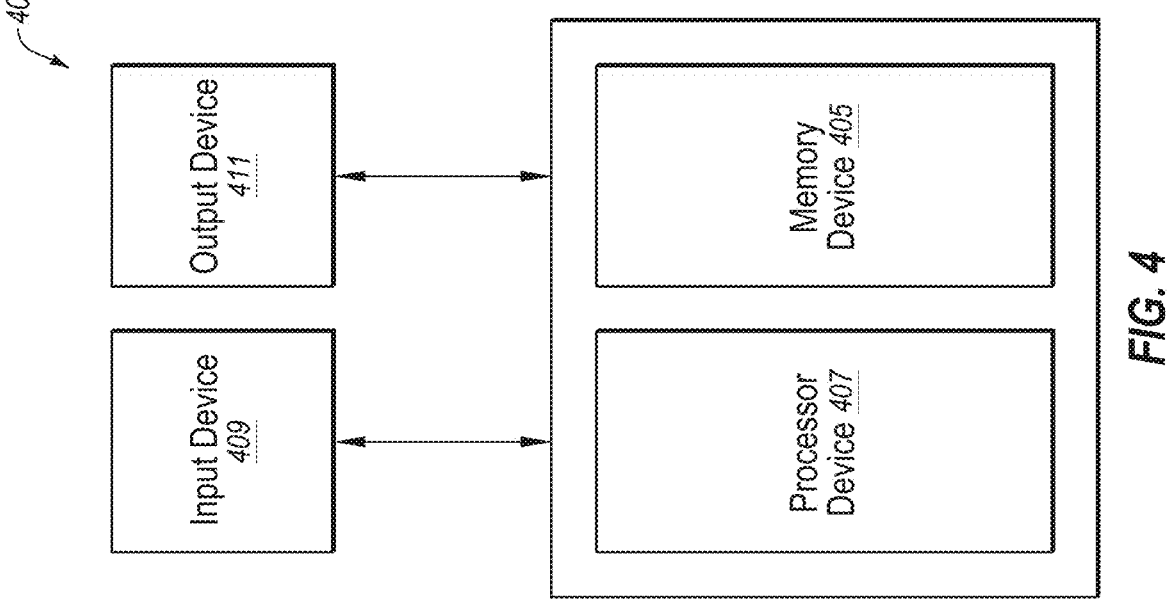
FIG. 4 is a block diagram of an electronic system, in accordance with embodiments of the disclosure.

Microelectronic devices (e.g., the microelectronic device 300) of the disclosure may be included in embodiments of electronic systems of the disclosure. For example, FIG. 4 is a block diagram of an electronic system 403, in accordance with embodiments of the disclosure. The electronic system 403 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 403 includes at least one memory device 405. The memory device 405 may include, for example, an embodiment of a microelectronic device previously described herein (e.g., the microelectronic device 300 previously described with reference to FIG. 3D through FIG. 3F).

The electronic system 403 may further include at least one electronic signal processor device 407 (often referred to as a "microprocessor"). The electronic signal processor device 407 may, optionally, include an embodiment of one or more of a microelectronic device and a microelectronic device structure previously described herein. The electronic system 403 may further include one or more input devices 409 for inputting information into the electronic system 403 by a user, such as, for example, a mouse or other pointing device, a keyboard, a touchpad, a button, or a control panel. The electronic system 403 may further include one or more output devices 411 for outputting information (e.g., visual or audio output) to a user such as, for example, a monitor, a display, a printer, an audio output jack, a speaker, etc. In some embodiments, the input device 409 and the output device 411 may comprise a single touchscreen device that can be used both to input information to the electronic system 403 and to output visual information to a user. The input device 409 and the output device 411 may communicate electrically with one or more of the memory device 405 and the electronic signal processor device 407.

Thus, in accordance with embodiments of the disclosure, an electronic system includes an input device, an output device, a processor device operably coupled to the input device and the output device, and a memory device operably coupled to the processor device. The memory device includes a first die and a second die vertically overlying the first die. The first die includes memory cells and sub word line driver (SWD) circuits coupled to the memory cells. The memory cells respectively include two transistors vertically overlapping and horizontally neighboring one another, and a capacitor vertically underlying and coupled to the two transistors. Each of the two transistors respectively include multiple channel regions, and multiple gate electrodes vertically neighboring the multiple channel regions. The SWD circuits are within a peripheral region horizontally neighboring the array region. Each of the SWD circuits comprising an additional transistor includes multiple additional channel regions, and multiple additional gate electrodes vertically neighboring the multiple additional channel regions. The second die includes sense amplifier (SA) circuits coupled to the memory cells and within a horizontal area of the array region.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
a first die, comprising:

an array region comprising memory cells respectively comprising:
a first transistor structure;
a second transistor structure horizontally neighboring the first transistor structure; and
a storage device vertically underlying and coupled to the first transistor structure and the second transistor structure; and
a peripheral region horizontally neighboring the array region and comprising sub word line driver (SWD) circuitry configured to effectuate control operations for the memory cells; and
a second die vertically overlying and attached to the first die, the second die comprising:
sense amplifier (SA) regions within a horizontal area of the array region of the first die and comprising SA circuitry configured to effectuate additional control operations for the memory cells; and
a complementary metal oxide semiconductor (CMOS) region horizontally neighboring some of the sense amplifier (SA) regions and comprising CMOS circuitry configured to effectuate further control operations of the memory cells.

2. The microelectronic device of claim 1, wherein:
the first transistor structure comprises:
semiconductive channel regions;
gate electrodes vertically neighboring the semiconductive channel regions; and
gate dielectric material vertically interposed between semiconductive channel regions and the gate electrodes; and
the second transistor structure vertically overlaps the first transistor structure and comprises:
additional semiconductive channel regions;
additional gate electrodes vertically neighboring the additional semiconductive channel regions; and
additional gate dielectric material vertically interposed between the additional semiconductive channel regions and the additional gate electrodes.

3. The microelectronic device of claim 2, further comprising:
digit line structures vertically interposed between the memory cells and the SA circuitry; and
digit line contact structures vertically underlying and in contact with the digit line structures, the digit line contact structures comprising:
a first digit line contact structure vertically extending to and in electrical communication with the first transistor structure; and
a second digit line contact structure horizontally neighboring the first digit line contact structure vertically extending to and in electrical communication with the second transistor structure.

4. The microelectronic device of claim 3, wherein the digit line structures individually comprise:
a first section horizontally extending in a first direction; and
second sections integral with the first section and horizontally projecting from the first section in a second direction orthogonal to the first direction, each of the second sections horizontally overlapping and in contact with one of the digit line contact structures.

5. The microelectronic device of claim 2, wherein the SWD circuitry within the peripheral region comprises third transistor structures vertically overlapping the first transistor structure and the second transistor structure of respective ones of the memory cells, the third transistor structures respectively comprising:

further semiconductive channel regions;

further gate electrodes vertically neighboring the further semiconductive channel regions; and further gate dielectric material vertically interposed between the further semiconductive channel regions and the further gate electrodes.

6. The microelectronic device of claim 5, wherein the third transistor structures of the SWD circuitry and each of the first transistor structure and the second transistor structure of the respective ones of the memory cells exhibit substantially the same geometric gate configuration as one another.

7. The microelectronic device of claim 1, wherein the first die further comprises capacitor structures within the peripheral region and vertically underlying the SWD circuitry.

8. The microelectronic device of claim 7, wherein the capacitor structures within the peripheral region vertically overlap the storage device of respective ones of the memory cells within the array region.

9. The microelectronic device of claim 1, wherein the storage device of respective ones of the memory cells comprises a capacitor structure, the capacitor structure including:

a first electrode in electrical communication with the first transistor structure;

a second electrode in electrical communication with the second transistor structure; and dielectric material interposed between the first electrode and the second electrode.

10. A memory device, comprising:

a first microelectronic device structure, comprising:

an array of memory cells, each of the memory cells of the array of memory cells respectively comprising:

a transistor comprising four vertically stacked channel regions;

an additional transistor comprising four additional vertically stacked channel regions; and a capacitor vertically underlying and in electrical communication with each of the transistor and the additional transistor; and a peripheral region horizontally neighboring the array of memory cells and comprising sub word line driver (SWD) circuits individually including a further transistor comprising four further vertically stacked channel regions; and a second microelectronic device structure bonded to the first microelectronic device structure and comprising sense amplifier (SA) circuits vertically overlying and within horizontal boundaries of the array of memory cells.

11. The memory device of claim 10, wherein the peripheral region of the first microelectronic device structure further comprises additional capacitors at a vertical elevation of the capacitor of each of the memory cells of the array of memory cells.

12. The memory device of claim 10, wherein:

the transistor is in electrical communication with a first electrode of the capacitor; and the additional transistor is in electrical communication with a second electrode of the capacitor.

13. The memory device of claim 10, further comprising digit lines in electrical communication with the array of memory cells and vertical interposed between the SA circuits and the array of memory cells.

14. The memory device of claim 10, wherein the second microelectronic device structure further comprises additional complementary metal oxide semiconductor (CMOS) circuits outside of the horizontal boundaries of the array of memory cells.

15. The memory device of claim 14, wherein the additional CMOS circuits are within a horizontal area of the peripheral region.

16. The memory device of claim 10, wherein the transistor and the additional transistor of a first of the memory cells are each vertically offset from the transistor and the additional transistor of a second of the memory cells horizontally neighboring the first of the memory cells.

17. An electronic system, comprising:

an input device;

an output device;

a processor device operably coupled to the input device and the output device; and a memory device operably coupled to the processor device and comprising:

a first die comprising:

memory cells within an array region and respectively comprising:

two transistors vertically overlapping and horizontally neighboring one another, each of the two transistors respectively comprising:

multiple channel regions; and multiple gate electrodes vertically neighboring the multiple channel regions; and a capacitor vertically underlying and coupled to the two transistors;

sub word line driver (SWD) circuits coupled to the memory cells and within a peripheral region horizontally neighboring the array region, each of the SWD circuits comprising an additional transistor comprising:

multiple additional channel regions; and multiple additional gate electrodes vertically neighboring the multiple additional channel regions; and a second die vertically overlying the first die, the second die comprising sense amplifier (SA) circuits coupled to the memory cells and within a horizontal area of the array region.

18. The electronic system of claim 17, wherein the first die further comprises conductive digit line structures vertically overlying and coupled to the memory cells.

19. The electronic system of claim 17, wherein the second die further comprises additional control logic circuitry outside of the horizontal area of the array region and configured to effectuate control operations for the memory cells of the first die.

20. The electronic system of claim 17, wherein the SA circuits of the second die comprise horizontally oriented transistors.

* * * * *